United States Patent
Ye et al.

(10) Patent No.: US 10,725,114 B2
(45) Date of Patent: Jul. 28, 2020

(54) SAMPLING DETECTION CIRCUIT AND METHOD FOR DETECTING A CIRCUIT MALFUNCTION

(71) Applicant: Contemporary Amperex Technology Co., Limited, Ningde, Fujian (CN)

(72) Inventors: Fuming Ye, Ningde (CN); Fupeng Cai, Ningde (CN); Qiandeng Li, Ningde (CN); Changjian Liu, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 46 days.

(21) Appl. No.: 16/286,557

(22) Filed: Feb. 26, 2019

(65) Prior Publication Data
US 2020/0025833 A1    Jan. 23, 2020

(30) Foreign Application Priority Data

Jul. 20, 2018    (CN) .......................... 2018 1 0805333

(51) Int. Cl.
*G01R 31/396*    (2019.01)
*G01R 31/367*    (2019.01)

(52) U.S. Cl.
CPC ......... *G01R 31/396* (2019.01); *G01R 31/367* (2019.01)

(58) Field of Classification Search
CPC ... G01R 31/396; G01R 31/367; H02J 7/0021; H02J 7/0019; Y02T 10/7016; Y02T 10/7061
(Continued)

(56) References Cited

U.S. PATENT DOCUMENTS

| | | | |
|---|---|---|---|
| 2004/0155629 A1 | 8/2004 | Kobayashi et al. | |
| 2019/0310321 A1* | 7/2019 | Chen ..................... | H02J 7/0019 320/121 |
| 2019/0207396 A1* | 10/2019 | Mi ........................ | G01R 31/396 320/118 |

FOREIGN PATENT DOCUMENTS

| CN | 106249099 A | 12/2016 |
|---|---|---|
| CN | 106772082 A | 5/2017 |

(Continued)

OTHER PUBLICATIONS

The extended European search report dated Oct. 25, 2019 for European Application No. 19160896.7, 11 pages.

*Primary Examiner* — Melissa J Koval
*Assistant Examiner* — Trung Nguyen
(74) *Attorney, Agent, or Firm* — Law Offices of Liaoteng Wang

(57) ABSTRACT

A method and apparatus for detecting a circuit malfunction. The method includes: receiving a detection instruction and controlling a plurality of equalization modules to be turned off in response to the detection instruction; collecting first sampled data of sampled equalization modules; controlling odd numbered equalization modules among the sampled equalization modules to be turned on and even numbered equalization modules among the sampled equalization modules to be turned off; collecting second sampled data of the sampled equalization modules; controlling the odd numbered equalization modules among the sampled equalization modules to be turned off and the even numbered equalization modules among the sampled equalization modules to be turned on; collecting third sampled data of the sampled equalization modules; and determining, according to the first sampled data, second sampled data and third sampled data, a malfunction in a sampling detection circuit and locating the malfunction.

18 Claims, 7 Drawing Sheets

(58) Field of Classification Search
USPC .......... 324/426–437, 500, 520–524, 750.01, 324/750.16, 600, 612, 616, 629, 638–650, 324/76.11, 216; 320/104–113, 127, 137, 320/165
See application file for complete search history.

(56) References Cited

FOREIGN PATENT DOCUMENTS

| | | |
|---|---|---|
| CN | 206992266 U | 2/2018 |
| EP | 2043221 A2 | 4/2009 |
| EP | 2848955 A1 | 3/2015 |
| JP | 2018004406 A | 1/2018 |
| KR | 20100023364 A | 3/2010 |

* cited by examiner

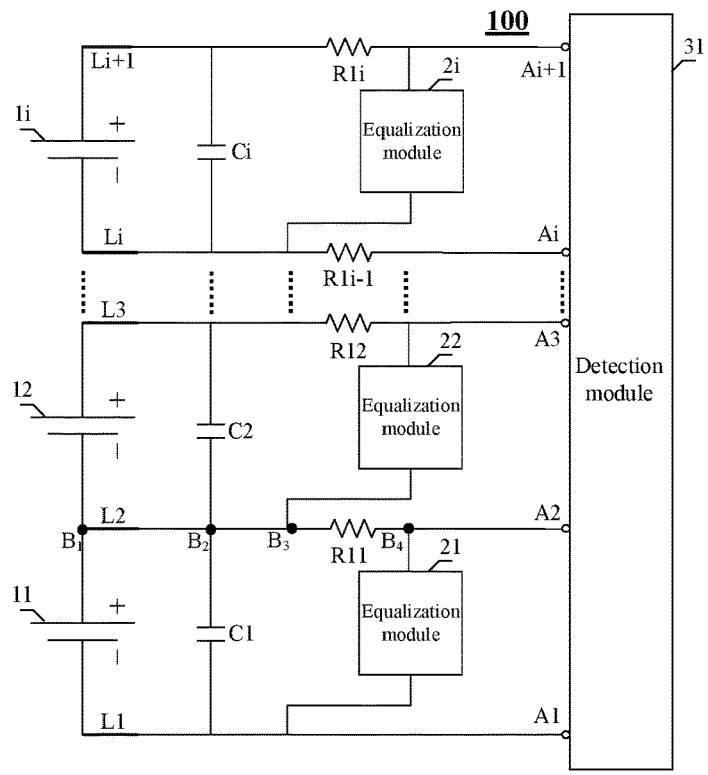

S210 — receiving a detection instruction, and controlling, in response to the detection instruction, all of the plurality of equalization modules to be turned off, and collecting first sampled data of sampled equalization modules S220 — controlling odd numbered equalization modules among the sampled equalization modules to be turned on and even numbered equalization modules among the sampled equalization modules to be turned off, and collecting second sampled data of the sampled equalization modules S230 — controlling the odd numbered equalization modules among the sampled equalization modules to be turned off and the even numbered equalization modules among the sampled equalization modules to be turned on, and collecting third sampled data of the sampled equalization modules S240 — determining, according to the first sampled data, the second sampled data and the third sampled data, a malfunction in the sampling detection circuit, and locating the malfunction

Fig. 2

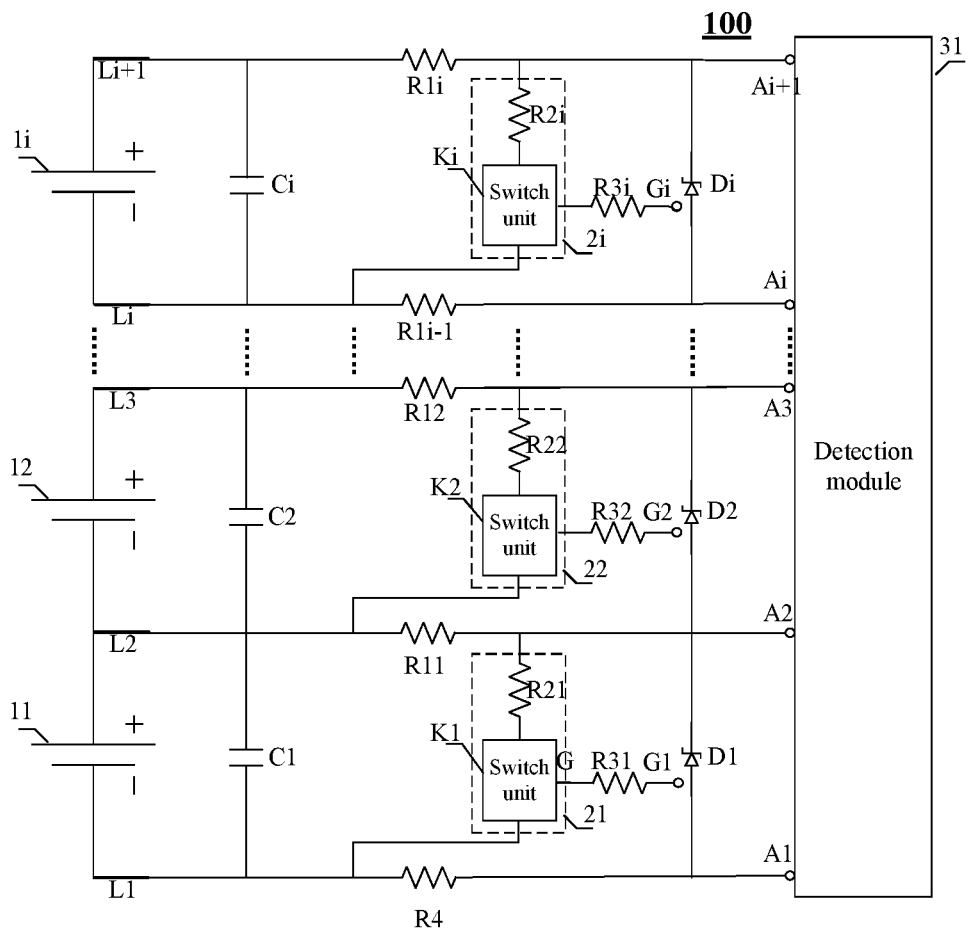

S241 determining, if second sampled data of a sampled equalization module and third sampled data of the sampled equalization module satisfy a first determination condition, a malfunction in the equalization module S242 determining, if second sampled data of a sampled equalization module and/or third sampled data of the sampled equalization module satisfy a second determination condition, a malfunction in a voltage sampling line corresponding to the equalization module

Fig. 4

SAMPLING DETECTION CIRCUIT AND METHOD FOR DETECTING A CIRCUIT MALFUNCTION

CROSS-REFERENCE TO RELATED APPLICATION

The present application is based upon and claims priority to Chinese Patent Application No. 201810805333.X, filed on Jul. 20, 2018, which is incorporated herein by reference in its entirety.

TECHNICAL FIELD

The present disclosure relates to the field of batteries, and more particularly to a sampling detection circuit and a method for detecting a circuit malfunction.

BACKGROUND

A battery module includes a plurality of battery cells connected in series. However, in practical application of the battery module, voltages of the battery cells are not exactly the same. Especially, after multiple charging and discharging of the battery module, there is a more obvious difference between voltages of different battery cells, which affects life and safety of the battery module.

Usually, an equalization circuit is used to solve the problem of voltage non-uniformity of battery cells in the battery module. However, if the equalization circuit is in malfunction, equalization effect by the equalization circuit will be affected.

SUMMARY

The embodiments of the present disclosure provide a sampling detection circuit and a method for detecting a circuit malfunction, with which it is possible to detect, according to first sampled data, second sampled data and third sampled data of sampled equalization modules, a malfunction in the sampling detection circuit and locate the malfunction.

In an aspect, there is provided a method for detecting a circuit malfunction, which is applicable to a sampling detection circuit. The sampling detection circuit includes: a plurality of energy storage modules, a plurality of equalization modules, and a plurality of first resistance modules, wherein one terminal of an energy storage module among the plurality of energy storage modules is connected to one terminal of a battery cell in a battery module, and the other terminal of the energy storage module is connected to the other terminal of the battery cell, and one terminal of an corresponding equalization module among the plurality of equalization modules is connected to one terminal of the battery cell, and the other terminal of the corresponding equalization module is connected to the other terminal of the battery cell. The first resistance module is disposed between the equalization module and the battery cell. The plurality of equalization modules are sequentially numbered in an arrangement order.

The method for detecting a circuit malfunction includes: receiving a detection instruction, and controlling, in response to the detection instruction, all of the plurality of equalization modules to be turned off, and collecting first sampled data of sampled equalization modules, wherein the sampled equalization modules include one or more of the plurality of equalization modules; controlling odd numbered equalization modules among the sampled equalization modules to be turned on and even numbered equalization modules among the sampled equalization modules to be turned off, and collecting second sampled data of the sampled equalization modules; controlling the odd numbered equalization modules among the sampled equalization modules to be turned off and the even numbered equalization modules among the sampled equalization modules to be turned on, and collecting third sampled data of the sampled equalization modules; and determining, according to the first sampled data, the second sampled data and the third sampled data, a malfunction in the sampling detection circuit, and locating the malfunction.

In another aspect, there is provided a sampling detection circuit. The sampling detection circuit includes at least a plurality of energy storage modules, a plurality of equalization modules, a plurality of first resistance modules and a detection module. One terminal of an energy storage module among the plurality of energy storage modules is connected to one terminal of a battery cell in a battery module, and the other terminal of the energy storage module is connected to the other terminal of the battery cell, and one terminal of an corresponding equalization module among the plurality of equalization modules is connected to one terminal of the battery cell, and the other terminal of the corresponding equalization module is connected to the other terminal of the battery cell. The first resistance module is disposed between the equalization module and the battery cell. The plurality of equalization modules are sequentially numbered in an arrangement order. The detection module is configured to: collect, in the case that all of the plurality of equalization modules are turned off, first sampled data of sampled equalization modules, wherein the sampled equalization modules include one or more of the plurality of equalization modules; collect, in the case that odd numbered equalization modules among the sampled equalization modules are turned on and even numbered equalization modules among the sampled equalization modules are turned off, second sampled data of the sampled equalization modules; collect, in the case that odd numbered equalization modules among the sampled equalization modules are turned off and even numbered equalization modules among the sampled equalization modules are turned on, third sampled data of the sampled equalization modules; and detect, according to the first sampled data, the second sampled data, a third sampled data, a malfunction in the sampling detection circuit and locating the malfunction.

In the method for detecting a circuit malfunction and the sampling detection circuit according to embodiments of the present disclosure, first sampled data of sampled equalization modules is collected in the case that all of the plurality of equalization modules are turned off; second sampled data of the sampled equalization modules is collected in the case that odd numbered equalization modules among the sampled equalization modules are turned on and even numbered equalization modules among the sampled equalization modules are turned off; and third sampled data of the sampled equalization modules is collected in the case that odd numbered equalization modules among the sampled equalization modules are turned off and even numbered equalization modules among the sampled equalization modules are turned on, third sampled data of the sampled equalization modules. If a sampled equalization loop comprising a sampled equalization module (i.e. a loop formed by the sampled equalization module being connected in series with a battery cell) is in malfunction, relationship between the second sampled data and the first sampled data of the sampled equalization loop and relationship between the third sampled data and the first sampled data of the sampled equalization loop would changes. Thus, when it is detected that relationship between second sampled data and first sampled data of a sampled equalization module and/or relationship between third sampled data and first sampled data of the sampled equalization module change, it can be determined that the sampling detection circuit has a malfunction and the malfunction is located in an equalization loop comprising the sampled equalization module.

BRIEF DESCRIPTION OF THE DRAWINGS

In order to more clearly illustrate technical solutions of embodiments of the present disclosure, figures used in embodiments of the present disclosure will be briefly described below. Other drawings can be obtained from these figures by those skilled in the art without any creative work.

FIG. 1 is a schematic structural diagram of a sampling detection circuit according to an embodiment of the present disclosure;

FIG. 2 is a flowchart of a method for detecting a circuit malfunction according to an embodiment of the present disclosure;

FIG. 3 is a schematic structural diagram of a sampling detection circuit according to an embodiment of the present disclosure;

FIG. 4 is a detailed flowchart of a method for detecting a circuit malfunction according to an embodiment of the present disclosure;

DETAILED DESCRIPTION

Figure 5A:
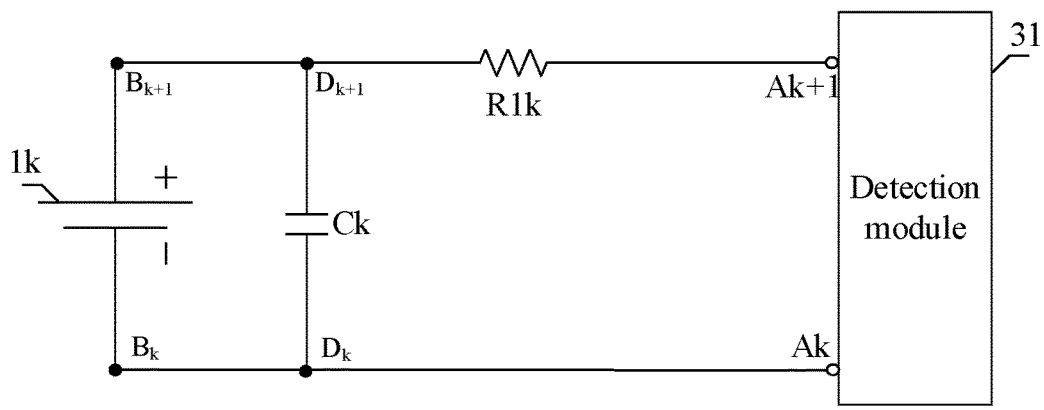
FIG. 5A and FIG. 5B are schematic structural diagrams of a part of a sampling detection circuit according to an example of an embodiment of the present disclosure.

Various aspects and exemplary embodiments of the present invention will be further described. The present invention will be described in detail below with reference to the accompanying drawings and embodiments in order to make purposes, technical solutions and advantages of the present invention clearer. It should be understood that the specific embodiments described herein are to be construed as illustrative only and not limiting. The present invention may be practiced by those skilled in the art without some of these specific details. The following description of the embodiments is merely provided to provide a better understanding of the invention.

It should be noted that, in this context, relational terms such as first and second, etc. are used merely to distinguish one entity or operation from another entity or operation, and do not necessarily require or imply these entities or operations actually have any such relationship or sequence between them. Furthermore, the term "comprise" or "include" or any other variants thereof is intended to encompass a non-exclusive inclusion, such that a process, method, article or device that comprises a plurality of elements includes not only those elements but also other elements that are not explicitly listed, or elements that are inherent to such a process, method, article or device. An element that is defined by the phrase "comprising" does not exclude presence of additional elements in the process, method, article or device that comprises the element.

The embodiments of the disclosure provides a method for detecting a circuit malfunction and a sampling detection circuit, which can detect, according to the first sampled data, the second sampled data and the third sampled data of sampled equalization modules, a malfunction of the sampling detection circuit and locate the malfunction. Specifically, the sampling detection circuit has energy storage modules and resistance modules for voltage division. When the sampling detection circuit is in malfunction, sampled data of the equalization modules would change due to change of sampled data of the energy storage modules or influence of the resistance modules. Thereby, it is possible to detect a malfunction in the sampling detection circuit and locate the malfunction by analyzing relationship between the first sampled data and the second sampled data of the sampled equalization module and/or relationship between the first sampled data and the third sampled data of the sampled equalization module.

It should be noted that the sampling detection circuit in embodiments of the present disclosure can also serve as an equalization circuit. When it is detected that voltages of battery cells in a battery module are inconsistent, it is possible to control the equalization modules to be turned on or turn off such that every voltages of the battery cells become equalized voltages.

In the case that the battery module connected with the sampling detection circuit includes i battery cells, the sampling detection circuit in embodiments of the present disclosure includes at least i energy storage modules, i equalization modules and i first resistance modules, where i is an integer not less than 2.

FIG. 1 is a schematic structural diagram of a sampling detection circuit 100 according to an embodiment of the present disclosure.

As shown in FIG. 1, the sampling detection circuit 100 includes at least i energy storage modules C1 to Ci, i equalization modules 21 to 2i, and i first resistance modules R11 to R1i.

One terminal of an energy storage module of the energy storage modules is connected to one terminal of a battery cell in the battery module, and the other terminal of the energy storage module is connected to the other terminal of the battery cell.

As an example, one terminal of the $k^{th}$ energy storage module is connected to one terminal of the $k^{th}$ battery cell in the battery module, and the other terminal of the $k^{th}$ energy storage module is connected to the other terminal of the $k^{th}$ battery cell, where k is an integer and $1 \leq k \leq i$.

For example, one terminal of the energy storage module C1 in FIG. 1 is connected to the cathode of the battery cell 11, the other terminal of the energy storage module C1 is connected to the anode of the battery cell 11; one terminal of the energy storage module C2 is connected to the cathode of the battery cell 12, and the other terminal of the energy storage module C2 is connected to the anode of the battery cell 12; . . . ; one terminal of the energy storage module Ci is connected to the cathode of the battery cell 1*i*, and the other terminal of the energy storage module Ci is connected to the anode of the battery cell 1*i*.

It should be noted that a voltage sampling line is connected to each terminal of a battery cell, and two adjacent batter cells share a same voltage sampling line.

For example, the voltage sampling lines L1 and L2 are connected to two terminals of the battery 11 respectively, and the battery cell 11 and its adjacent battery cell 12 share the same voltage sampling line L2.

One terminal of a corresponding equalization module is connected to one terminal of the battery cell, and the other terminal of the corresponding equalization module is connected to the other terminal of the battery cell. A first resistance module is disposed between the equalization module and the battery cell. The plurality of equalization modules are sequentially numbered according to an arrangement order. The equalization module can be turned on or off. When the equalization module is turned on, the first resistance module can provide voltage division for the equalization module.

As an example, one terminal of the $k^{th}$ energy storage module is connected to one terminal of the $k^{th}$ battery cell, and the other terminal of the $k^{th}$ energy storage module is connected to the other terminal of the $k^{th}$ battery cell, and the $k^{th}$ first resistance module is disposed between the $k^{th}$ equalization module and the $k^{th}$ battery cell.

For example, the i equalization modules in FIG. 1 are numbered from 11 to 1*i* in the order of arrangement. One terminal of the equalization module 21 is connected to one terminal of the battery 11, the other terminal of the equalization module 21 is connected to the other terminal of the battery 11, and the first resistance module R11 is disposed between the equalization module 21 and the battery cell 11; one terminal of the equalization module 22 is connected to one terminal of the battery cell 12, the other terminal of the equalization module 22 is connected to the other terminal of the battery cell 12, and the first resistance module R12 is disposed between the equalization module 22 and the battery cell 12; . . . ; one terminal of the equalization module 2*i* is connected to one terminal of the battery cell 1*i*, the other terminal of the equalization module 2*i* is connected to the other terminal of the battery cell 1*i*, and the first resistance module R1*i* is disposed between the equalization module 2*i* and the battery cell 1*i*.

It should be noted that the first resistance module plays a role of voltage division for the equalization module. Therefore, location of the first resistance module according to embodiments of the present disclosure is not limited to the position of the first resistance module shown in FIG. 1, and the first resistance module may be disposed on any position in an equalization loop comprising the equalization module and the battery cell.

As an example, the first resistance module may be disposed on an overlapping portion of an energy storage loop comprising an energy storage module and a battery cell and an equalization loop comprising a corresponding equalization module and the battery cell.

For example, an equalization loop comprising the battery cell 11 and the equalization module 21 includes points B1, B2, B3, and B4. In this case, the first resistance module R11 may be disposed at a position of the equalization loop between the point B1 and the point B2 in addition to between the point B3 and the point B4.

For convenience of explanation, the following embodiments of the present disclosure will be explained by taking the first resistance module between B3 and B4 as an example.

As another example, the first resistance module may be disposed in an overlapping portion of an equalization loop comprising an equalization module and a battery cell and an equalization loop comprising an adjacent equalization module and another battery cell.

For example, the first resistance module R11 may be disposed in an equalization loop between the point B2 and the point B3. In this case, the first resistance module R11 is disposed on the equalization loop comprising the battery cell 11 and the equalization module 21, and the first resistance module R11 is simultaneously disposed on the equalization loop comprising the battery cell 12 and the equalization module 22.

In some embodiments of the present disclosure, the sampling detection circuit in the embodiments may be applied in a method for detecting a circuit malfunction 200. FIG. 2 is a flowchart of a method for detecting a circuit malfunction according to an embodiment of the present disclosure. The method for detecting a circuit malfunction 200 is applicable to the sampling detection circuit 100 described in the above embodiments.

As shown in FIG. 2, the method for detecting a circuit malfunction 200 include steps S210 to S240.

At step S210, a detection instruction is received, and in response to the detection instruction, a plurality of equalization modules are controlled to be turned off. First sampled data of sampled equalization modules are collected. The sampled equalization modules include one or more of the plurality of equalization modules.

In the step S210, a detection instruction that detects if the sampling detection circuit has a malfunction or not may be sent to the sampling detection circuit before the sampling detection circuit is used to perform an equalization processing on the battery cells in the battery module or when a malfunction detection is required for the sampling detection circuit.

In some embodiments of the present disclosure, the sampled equalization modules are used for detection as to whether an equalization loop comprising a sampled equalization module has a malfunction. If it is detected that a sampled equalization module has a malfunction, the sampling detection circuit is determined to be in malfunction, and the malfunction is located to an equalization loop comprising sampled equalization module.

In some embodiments of the disclosure, the first sampled data may be one or more of voltage, current, or resistance.

It should be noted that in the case where the first sampled data is voltage and all of the equalization modules are turned off, if a sampled equalization modules is normally turned off or open-circuited, the voltage collected across the sampled equalization module is a voltage across a battery cell corresponding to the sampled equalization module. If the sampled equalization module is short-circuited, the voltage collected across the equalization module is a voltage allocated by the battery cell corresponding to the sampled equalization module to the sampled equalization module.

In some embodiments of the present disclosure, two sampling points may be set respectively at two terminals of a sampled equalization module for collecting sampled data of the sampled equalization module. For example, two sampling points A1 and A2 may be set respectively at two terminals of the equalization module 21, and two sampling point A2 and A3 may be set respectively at two terminals of the equalization module 22.

As an example, after reception of the detection instruction and in response to the detection instruction, all of the equalization modules 21 to 2i are turned off, and the first sampled data is collected at sampling points of both terminals of each of the sampled equalization modules. For example, in the case that the equalization module 21 and the equalization module 22 are used as sampled equalization modules, the first sampled data of the equalization module 21 is collected at the sampling point A1 and the sampling point A2, and the first sampled data of the equalization modules 22 is collected at the sampling point A2 and the sampling point A3.

At step S220, odd numbered equalization modules among the sampled equalization modules are controlled to be turned on and even numbered equalization modules among the sampled equalization modules are controlled to be turned off, and second sampled data of the sampled equalization modules are collected.

The type of the second sampled data is the same as the type of the first sampled data in the step S210, and thus details are not described herein again.

As an example, k denotes an odd number, and the first equalization module 21 to the $(k+2)^{th}$ equalization module $2k+2$ are used as sampled equalization modules. All odd numbered equalization modules among the first equalization module 21 to the $(k+2)^{th}$ equalization module $2k+2$ are controlled to be turned on, and all even numbered equalization modules among the first equalization module 21 to the $(k+2)^{th}$ equalization module $2k+2$ are controlled to be turned off. In this case, the $(k+1)^{th}$ equalization module $2k+1$ is turned off, and the $k^{th}$ equalization module $2k$ adjacent to and the $(k+1)^{th}$ equalization module $2k+1$ and the $(k+2)^{th}$ equalization module $2k+2$ are turned on.

For example, the first equalization module 21 to the fifth equalization module 25 are used as sampled equalization modules. The equalization module 21, the equalization module 23 and the equalization module 25 among the equalization module 21 to the equalization module 25 are turned on, and the equalization module 22 and the equalization module 24 among the equalization module 21 to the equalization module 25 are turned off.

It should be noted that, under normal circumstances, the second sample data of a sampled equalization module in the step S220 is equal to a voltage allocated by a corresponding battery cell for the sampled equalization module. When the sampled equalization module is open-circuited or short-circuited, the second sampled data of the sampled equalization module is equal to the first sampled data of the sampled equalization module.

Under normal circumstances, the second sample data of an even numbered equalization module among the sampled equalization module is equal to a voltage across a corresponding battery cell. When the sampled equalization module is open-circuited, the second sampled data of the sampled equalization module is equal to a voltage across the corresponding battery cell. When the sampled equalization module is short-circuited, the second sample data of the sampled equalization module is equal to a voltage allocated by the corresponding battery cell for the sampled equalization module.

At step S230, the odd numbered equalization modules among the sampled equalization modules are controlled to be turned off and the even numbered equalization modules among the sampled equalization modules are controlled to be turned on, and third sampled data of the sampled equalization modules are collected.

The type of the third sampled data is the same as the type of the first sampled data in the step S210, and details are not described herein again.

As an example, if k denotes a non-zero even number, and the first equalization module 21 to the $(k+1)^{th}$ equalization module $2k+1$ are used as sampled equalization modules. All odd numbered equalization modules among the first equalization module 21 to the $(k+1)^{th}$ equalization module $2k+1$ are controlled to be turned off, and all even numbered equalization modules among the first equalization module 21 to the $(k+1)^{th}$ equalization module $2k+1$ are controlled to be turned on.

For example, the first equalization module 21 to the fourth equalization module 24 are sampled equalization modules. The equalization module 21 and the equalization module 23 among the equalization module 21 to the equalization module 24 are turned off, and the equalization module 22 and the equalization module 24 among the equalization module 21 to the equalization module 24 are turned on.

It should be noted that, in the step S230, the third sampled data of an odd numbered sampled equalization module among the sampled equalization modules is normally equal to a voltage across a corresponding battery cell. When the sampled equalization module is open-circuited, the third sampled data of the sampled equalization module is equal to the voltage across the corresponding battery cell; when the sampled equalization module is short-circuited, the third sampled data of the sampled equalization module is equal to a voltage allocated by a the corresponding battery cell for the sampled equalization module.

The third sampled data of an even numbered equalization module among the sampled equalization modules is normally equal to a voltage allocated by a corresponding battery cell for the sampled equalization module. When the sampled equalization module is open-circuited, the third sampled of the sampled equalization module is equal to a voltage across the corresponding battery cell. When the sampled equalization module is short-circuited, the third sampled data of the sampled equalization module is equal to a voltage allocated by the corresponding battery cell for the sampled equalization module.

At step S240, a malfunction in the sampling detection circuit is determined and the malfunction is located according to the first sampled data, the second sampled data and the third sampled data.

In the method for detecting a circuit malfunction in embodiments of the present disclosure, first sampled data of sampled equalization modules is collected in the case that all of the plurality of equalization modules are turned off; second sampled data of the sampled equalization modules is collected in the case that odd numbered equalization modules among the sampled equalization modules are turned on and even numbered equalization modules among the sampled equalization modules are turned off; and third sampled data of the sampled equalization modules is collected in the case that odd numbered equalization modules among the sampled equalization modules are turned off and even numbered equalization modules among the sampled equalization modules are turned on, third sampled data of the sampled equalization modules. If a sampled equalization loop comprising a sampled equalization module (i.e. a loop formed by the sampled equalization module being connected in series with a battery cell) has a malfunction, relationship between the second sampled data and the first sampled data of the sampled equalization loop and relationship between the third sampled data and the first sampled data of the sampled equalization loop would changes. Thus, when it is detected that relationship between the second sampled data and the first sampled data of a sampled equalization module and/or relationship between the third sampled data and the first sampled data of the sampled equalization module change, it can be determined that the sampling detection circuit has a malfunction and the malfunction may be located in an equalization loop comprising the sampled equalization module.

In some embodiments of the present disclosure, each of the equalization modules 21 to 2i may include at least a switch unit and a resistor unit, wherein one terminal of the switch unit is connected to one terminal of the resistor unit. For example, the switch unit and the resistor unit included in the equalization module may form an equalization loop together with a battery cell connected with the equalization module.

By controlling on and off of the switch unit, the equalization module can be controlled to be turned on or off.

In an embodiment of the present disclosure, the switch unit may include a semiconductor field effect transistor. The semiconductor field effect transistor may be turned on or off according to a detection instruction received by a control terminal of the semiconductor field effect transistor.

The detection instruction may include: a high level signal and a low level signal. For example, when the control terminal of the semiconductor field effect transistor receives a high level signal, the semiconductor field effect transistor is turned on; when the control terminal of the semiconductor field effect transistor receives a low level signal, the semiconductor field effect transistor is turned off.

It should be noted that the switch unit in embodiments of the present disclosure is not limited to a semiconductor field effect transistor, and may be another electronic device or a functional module capable of turning on the switch unit and turning off the switch unit.

In an embodiment, the sampling detection circuit 100 may further include a plurality of second resistance modules.

In another embodiment, the sampling detection circuit 100 may further include a plurality of diodes.

In still another embodiment, the sampling detection circuit 100 may further include one or more third resistance modules.

A sampling detection circuit will be described below according an embodiment including a plurality of second resistance modules, a plurality of diodes, and a third resistance module.

FIG. 3 is a schematic structural diagram of a sampling detection circuit 100 according to an embodiment of the present disclosure. FIG. 3 is different from FIG. 1 in that the sampling detection circuit 100 further includes: a plurality of second resistance modules R31 to R3i, and a plurality of diodes D1 to Di and a third resistance module R4.

Each of the plurality of second resistance modules R31 to R3i is connected to a control terminal of a corresponding switch unit.

The second resistance module is used to protect the switch unit, and the second resistance module can reduce current flowing through the switch unit to prevent damage to the switch unit when the current received by the control terminal is excessive. In particular, when the switch unit includes a semiconductor field effect transistor, the second resistance module can well protect the semiconductor field effect transistor.

Each of the plurality of diodes D1 to Di corresponds to a corresponding equalization module and is connected in anti-parallel with the equalization module.

The plurality of diodes function as a voltage regulator to prevent damage to the detection module 31 due to excessive voltage across the equalization module. As an example, the diodes D1 to Di in FIG. 3 may be Transient Voltage Suppressor (TVS) diodes.

Each of the one or more third resistance modules R4 may be disposed between a battery cell and a sampling point.

Some circuit between a battery cell and a certain sampling point is provided with the first resistance module. The first resistance module provides protection for the detection module 31 in addition to provide voltage division for a corresponding equalization module.

For example, the first resistance module R11 may be disposed between the battery cell 11 and the sampling point A2.

Some circuit between the battery cell and a certain sampling point is not provided with the first resistance module, so the third resistance module may be provided on the circuit to protect the detection module 31.

For example, the first resistance module is not disposed on the circuit between the battery cell 11 and the sampling point A1, so the third resistance module may be disposed on the circuit between the battery cell 11 and the sampling point A1.

In some embodiments of the present disclosure, the equalization module may include a switch unit and a resistor unit. As an example, the $k^{th}$ equalization module 2k includes a switch unit Kk and a resistor unit R2k.

For example, the equalization module 22 includes a switch unit K2 and a resistor unit R22.

The control terminal of each switch unit is connected with a second resistance module. As an example, the control terminal Gk of the $k^{th}$ switch unit Kk is connected to a second resistance module R3k.

For example, the control terminal G of the switch unit K1 is connected to the second resistance module R31.

Each of the diodes is connected in anti-parallel with a corresponding equalization module. As an example, the $k^{th}$ equalization module is connected in anti-parallel with the diode $D_k$ via its two terminals, and the anode of the diode $D_k$ is connected to a sampling point Ak which connected to a first terminal of the equalization module 2k, and the cathode of the diode $D_k$ is connected a sampling point Ak+1 which is connected to a second terminal of the equalization module 2k. The first terminal of the equalization module 2k is one terminal of the equalization module 2k connected to anode of a battery cell 1k, and the second terminal of the equalization module 2k is another terminal of the equalization module 2k connected to the cathode of the battery cell 1k.

For example, the equalization module 21 is connected in anti-parallel with the diode D1 via its two terminals, and the anode of the diode D1 is connected to the sampling point A1, and the cathode of the diode D1 is connected to the sampling point A2. The sampling point A1 is a sampling point connected to a first terminal of the equalization module 21, and the sampling point A2 is a sampling point connected to a second terminal of the equalization module 21.

In an example, the number of resistors in the first resistance module, the second resistance module, the third resistance module and the resistor unit in the embodiments may be one or plural, and combination of resistance is not limited.

In an example, the energy storage module in the embodiments may include one or more capacitors.

In an example, the switch unit may include one or more semiconductor field effect transistors.

In an optional example, the resistance value of the first resistance module connected in series with a battery cell and the resistance value of the equalization module connected in series with the battery cell are smaller than the resistance value of the energy storage module connected across the battery cell.

For convenience of description, the present disclosure will be further described in detail by way of an example where all of equalization modules in the sampling detection circuit are used as sampled equalization module, and the first sampled data, the second sampled data and the third sampled data of a sampled equalization module are all voltage of the sampled equalization module.

In some embodiments of the present disclosure, a malfunction in the sampling detection circuit may include a malfunction of a voltage sampling line of a battery cell and/or a malfunction of an equalization module. FIG. 4 is a detailed flowchart of a method for detecting a circuit malfunction according to an embodiment of the present disclosure. The same reference signs are used for the same or equivalent steps in FIG. 4 as in FIG. 2. As shown in FIG. 4, the step S240 may be specifically implemented by the steps S241 and S242 in accordance with an embodiment of the present disclosure.

At step S241, a malfunction in the equalization module is determined if the second sampled data of a sampled equalization module among the sampled equalization module and the third sampled data of the sampled equalization module satisfy a first determination condition, wherein the first determination condition is related to the first sampled data of the sampled equalization module.

In an embodiment of the present disclosure, the first determination condition may include: the second sampled data is equal to the first sampled data, and the third sampled data is equal to the first sampled data.

A malfunction in an equalization module may be caused by the equalization module being open-circuited or short-circuited. For example, as shown in FIG. 3, an equalization module includes a switch unit and a resistor unit. In this case, the equalization module being open-circuited may be caused by that the switch unit is turned off, and the equalization module being short-circuited may be caused by the switch unit is turned on.

Therefore, the following descriptions of the embodiments are further provided in detail with respect to the first sampled data, the second sampled data and the third sampled data of the sampled equalization module by way of an example where the equalization module is open-circuited and another example where the equalization module is short-circuited.

In order to further improve accuracy for determine a malfunction in the equalization module, the first determining condition may further include: the first sampled data, the second sampled data and the third sampled data are not zero.

It should be noted that, in embodiments of the present disclosure, when an equalization module is in malfunction, the sampled data of an adjacent equalization module is not affected. Therefore, a part of a sampling detecting circuit will be explained in accordance with the present example, the first example and the second example specifically described below.

As a first example, FIG. 5A is a schematic structural diagram of a part of a sampling detection circuit in accordance with an example of an embodiment of the present disclosure, in which the equalization module is open-circuited in the sampling detection circuit.

As shown in FIG. 5A, if the $k^{th}$ equalization module $2k$ in the sampling detection circuit is open-circuited, when the steps S210 to S230 are being performed:

The first sampled data $V_{1k}$ of the equalization module $2k$ acquired by the step S210 is a voltage $V_{0k}$ across the battery cell $1k$.

The second sampled data $V2k$ of the equalization module $2k$ acquired by the step S220 is a voltage $V_{0k}$ across the battery cell $1k$. Thus, the second sampled data $V2k$ of the equalization module $2k$ is equal to the first sampled data $V_{1k}$ of the equalization module $2k$.

The third sampled data $V_{3k}$ of the equalization module $2k$ acquired by the step S230 is a voltage $V_{0k}$ across the battery cell $1k$. Thus, the third sample data $V_{3k}$ of the equalization module $2k$ is equal to the first sample data $V_{1k}$ of the equalization module $2k$.

Thus, in the case where an equalization module is open-circuited/disconnected, even if the equalization module is controlled to be turned on, state of the equalization module is always kept open-circuited/disconnected. Therefore, the second sampled data and the third sampled data of the equalization module satisfy the first determination condition.

It should be noted that, the odd numbered equalization modules are controlled to be turned on and the even numbered equalization modules are controlled to be turned off in the step S220, and the odd numbered equalization modules are controlled to be turned off and the even numbered equalization modules are controlled to be turned on in the step S230. In the case where voltages for two adjacent equalization modules in the battery module are substantially the same as each other, if the second sampled data or the third sampled data of each of the two adjacent equalization modules are the same, it can be determined that one of the two equalization modules must be in open-circuited/disconnected. Thus, it is possible to determine the equalization module being in malfunction by determining whether the second sampled data or the third sampled data of two adjacent equalization modules are the same or not.

It should be noted that when multiple equalization modules in the sampling detection circuit are open-circuited, the first sampled data, the second sampled data and the third sampled data of each of the equalization modules are consistent with the situation described in the first example.

Figure 5B:
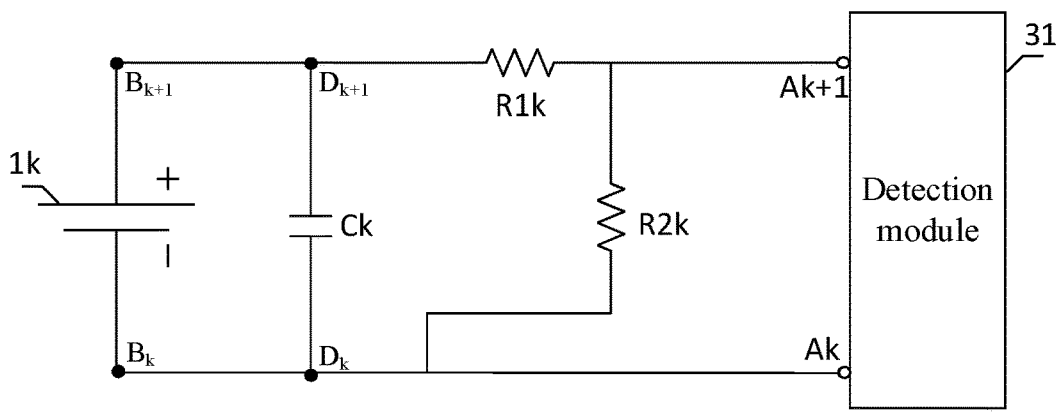

As a second example, FIG. 5B is a schematic structural diagram of a part of a sampling detection circuit in accordance with an example of an embodiment of the present disclosure.

As shown in FIG. 5B, it is assumed that resistance of the switch unit is zero and the $k^{th}$ equalization module $2k$ in the sampling detection circuit is short-circuited. When the steps S210 to S230 are performed, it is always that voltage across the resistor unit $R2k$ is sampled. Details are provided as follows.

The first sampled data $V_{1k}$ of the equalization module $2k$ acquired by the step S210 is a product of a voltage $V_{0k}$ across the battery cell $1k$ and a voltage division coefficient $\alpha_k$ of the equalization module $2k$, $V_{0k} \times \alpha_k$, where $\alpha_k$ satisfies the formula (1):

$$\alpha_k = R_{2k}/(R_{1k}+R_{2k}) \qquad (1)$$

where $R_{1k}$ represents resistance value of the first resistance module $R1k$, and $R_{2k}$ represents resistance value of the resistor unit $R2k$.

The second sampled data $V_{2k}$ of the equalization module $2k$ acquired by the step S220 is $V_{0k} \times \alpha_k$.

The third sampled data $V_{3k}$ of the equalization module $2k$ acquired by the step S230 is $V_{0k} \times \alpha_k$.

In this case, the second sampled data and the third sampled data of the equalization module satisfy the first determination condition.

It should be noted that, when the equalization module is short-circuited, the voltage of the equalization module acquired by the step S210 is a product of the voltage across the corresponding battery cell and the voltage division coefficient of the equalization module. In the case that voltages of respective batter cells in the battery module are substantially the same, voltage division coefficients of respective equalization modules are substantially the same and the second sampled data and the third sampled data of an equalization module satisfy the first determination condition, if the first sampled data of an equalization module is smaller than the first sampled data of each of the other equalization modules, it is determined that the equalization module is in malfunction due to being shorted-circuited, and if the first sampled data of an equalization module is substantially equal to the first sampled data of each of the other equalization modules, it is determined that the equalization module is in malfunction due to being open-circuited.

It should be noted that, when multiple equalization modules in the sampling detection circuit are short-circuited, the first sampled data, the second sampled data and the third sampled data of each of equalization modules are consistent with the situation described in the second example.

From the first example and the second example, it can be known that when one or more equalization modules are shorted-circuited/open-circuited, the second sample data and the third sample data of an involved equalization module satisfy the first determination condition. Therefore, if the second sampled data and the third sampled data of an equalization module satisfy the first determination condition, it can be determined that the equalization module is in malfunction.

At step S242, if the second sampled data of a sampled equalization modules among the sampled equalization module and/or the third sampled data of the sampled equalization module satisfy a second determination condition, a malfunction in a voltage sampling line corresponding to the equalization module is determined. The second determination condition is related to the first sampled data of the sampled equalization module.

In an embodiment of the present disclosure, a malfunction of a voltage sampling line may include the voltage sampling line is open-circuited. For example, as shown in FIG. 5A and FIG. 5B, the situation where a voltage sampling line for the battery cell $1k$ is open-circuited may include: a voltage sampling line between the point $B_k$ and the point $D_k$ is open-circuited and/or a voltage sampling line between the point $B_k+1$ and point the $D_k+1$ is open-circuited.

In this case, the second determination condition may include: a first determination sub-condition or a second determination sub-condition.

The first determination sub-condition may include: the second sampled data of an odd numbered equalization module among the sampled equalization module is smaller than a first threshold, or the third sampled data of the odd numbered equalization module is greater than the first sample data of the odd numbered equalization module.

The second determination sub-condition may include: the second sampled data of an even numbered equalization module among the sampled equalization modules is greater than the first sampled data of the even numbered equalization module, or the third sampled data of the even numbered equalization module is smaller than a second threshold.

The first threshold is a product of the first sampled data of the odd numbered equalization module and a voltage division coefficient of the odd numbered equalization module.

The second threshold is a product of the first sampled data of the even numbered equalization module and a voltage division coefficient of the even numbered equalization module.

A voltage sampling line shared by two adjacent battery cell may be used as a first voltage sampling line, and a voltage sampling line only for a single battery cell may be used as a second voltage sampling line. The following sections are described with respect to four examples to illustrate a malfunction in a first voltage sample line and a malfunction in a second voltage sample line, respectively. Among the examples, the third example are descriptions of a malfunction of a first voltage sampling line, and the fourth example, the fifth example and the sixth example are descriptions of a malfunction of a second voltage sampling line.

As a third example, a malfunction of a first voltage sampling line in this example will be specifically explained below by taking i=2 as an example. In the example, the equalization module 21 represents an odd numbered equalization module among the sampled equalization modules, and the equalization module 22 represents an even numbered equalization module among the sampled equalization modules.

Figure 6A:
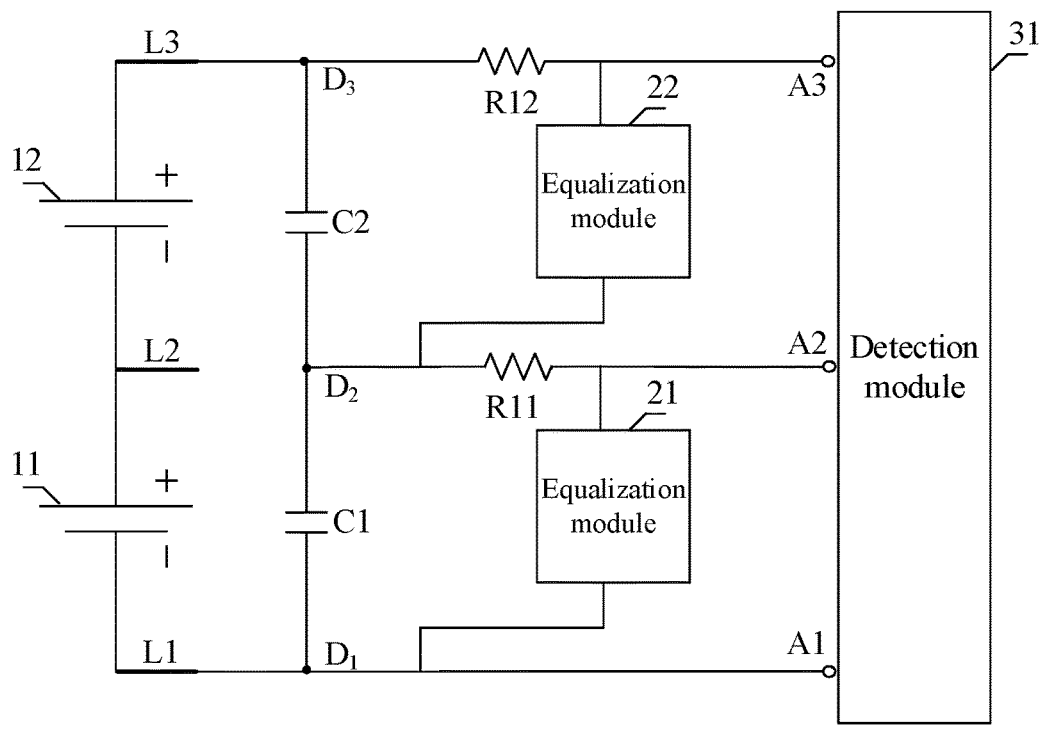
FIG. 6A is a schematic structural diagram of a sampling detection circuit according to an example of an embodiment of the present disclosure.

FIG. 6A is a schematic structural diagram of a sampling detection circuit according to an example of an embodiment of the disclosure. As shown in FIG. 6A, the sampling detection circuit includes voltage sampling lines L1, L2, and L3. Since the voltage sampling line L2 is common to the battery cell 11 and the battery cell 12, L2 is used as a first voltage sampling line for convenience of description. Since the voltage sampling line L1 is provided only for the battery cell 11, the voltage sampling line L3 is provided only for the battery cell 12, the voltage sampling line L1 and the voltage sampling line L3 are used as second voltage sampling lines for convenience of description.

When the voltage sampling line L2 is in malfunction, the battery cell 11 for which the voltage sampling line L2 is provided is connected in series with the battery cell 12. The battery cell 11, the battery cell 12, the energy storage module C1 and the energy storage module C2 together form a series circuit. The battery cell 11 and the battery cell 12 provide a voltage that is distributed on the energy storage module C1 and the energy storage module C2. The voltage distributed on an energy storage module is proportional to impedance of the energy storage module. For example, in the case that the voltage sampling line L2 is in malfunction and impedance of the energy storage module C1 is a fixed value, as impedance of the energy storage module C2 increases, a voltage division coefficient of the equalization module C2 also becomes larger. Correspondingly, since the voltage between the points $D_1$ and $D_3$ is always equal to a sum of the voltage of the battery cell 11 and the voltage of the battery cell 12, the voltage distributed on the energy storage module C2 also increases as the impedance of the energy storage module C2 increases.

When the step S210 is performed, both the equalization module 21 and the equalization module 22 are turned off. The first sampled data $V_{11}$ collected across the equalization module 21 is the voltage $V_{C11}$ across the energy storage module C1. The first sampled data $V_{12}$ collected across the equalization module 22 is the voltage $V_{C12}$ across the energy storage module C2.

For example, in the case that impedances of respective energy storage modules in the sampling detection circuit are the same, voltages of respective battery cells are the same, i.e. $V_{C10}$, then $V_{11}=V_{12}=V_{C10}$.

When the step S220 is performed, the first resistance module R11 and the equalization module 21 are connected in series, and then connected in parallel with the energy storage module C1. In this case, since the equalization module 21 is turned on, it is equivalent that the energy storage module C1 is connected in parallel with a first shunt resistor. Accordingly, an equivalent impedance between the points $D_1$ and $D_2$ is smaller than the impedance of the energy storage module C1. The resistance of the first shunt resistor is equal to a sum of the resistance of the equalization module 21 and the resistance of R11 when equalization module is turned on. Because the voltage of the energy storage module C1 is less than $V_{11}$, the second sampled data V21 collected across the equalization module 21 is smaller than $V_{11} \times \alpha_1$, and the second sampled data $V_{22}$ collected across the equalization module 22 is greater than $V_{12}$, wherein $\alpha_1$ is a voltage division coefficient of the equalization module 21.

When the step S230 is performed, since the equalization module 22 is turned on, it is equivalent that the energy storage module C2 is connected in parallel with a second shunt resistor. Accordingly, an equivalent impedance between the points $D_2$ and $D_3$ is smaller than the impedance of the energy storage module C2. The resistance of the second shunt resistor is equal to a sum of the resistance of the equalization module 22 and the resistance of R12 when the equalization module 22 is turned on. In this case, the voltage of the energy storage module C2 is less than $V_{12}$, and correspondingly, the third sampled data $V_{32}$ collected across the equalization module 22 is smaller than $V_{12} \times \alpha_2$ and the third sampled data V31 collected across the equalization module 21 is greater than $V_{11}$, wherein $\alpha_2$ is a voltage division coefficient of the equalization module 22. The calculation of $\alpha_1$ and $\alpha_2$ is the same as the calculation of $\alpha_k$, and will not be described here again.

It should be noted that, if multiple adjacent first voltage sampling lines in the sampling detection circuit are in malfunction, battery cells corresponding to a first voltage sampling line that is in malfunction are connected in series, and energy storage modules corresponding to the first voltage sampling line that is in malfunction are connected in series.

In the case that equalization modules corresponding to the first voltage sampling line that is in malfunction are used as sampled equalization module, when the step S220 is performed, the second sampled data of an odd numbered equalization module among the sampled equalization modules is smaller than a product of the first sampled data and the voltage division coefficient of the equalization module, and the second sampled data of an even numbered equalization module among the sampled equalization modules is larger than the first sampling data. When the step S230 is performed, the third sample data of an odd numbered equalization module among the sampled equalization module is larger than the first sampling data, and the third sample data of an even numbered equalization module among the sampled equalization modules is smaller than a product of the first sample data and a voltage division coefficient of the equalization module.

Therefore, if a first voltage sampling line is in malfunction, two adjacent battery cells corresponding to the voltage sampling line are connected in series, and two energy storage modules corresponding to the two battery cells are connected in series. In this case, when an equalization module in parallel with an energy storage module is turned on, voltage across the energy storage module changes, which in turn causes voltage across the equalization module to change. Therefore, if the second sampled data or the third sampled data of an equalization module in the sampling detection circuit satisfies the second determination condition, it can be determined that the first voltage sampling line corresponding to the equalization module is in malfunction.

As a fourth example, a second voltage sampling line corresponding to an odd numbered equalization module is open-circuited. For example, a second voltage sampling line corresponding to a first battery cell in the battery module is open-circuited, or, a second voltage sampling line corresponding to a last battery cell in the battery module is open-circuited in the case that the battery module has an odd number of battery cells.

It should be noted that when a second voltage sampling line corresponding to an equalization module is open-circuited, sampled data of an adjacent equalization module is not affected. Therefore, in the present example and the fifth and sixth examples described below, a malfunction of a second voltage sampling line will be specifically explained by way of a part of the sampling detection circuit.

Figure 6B:
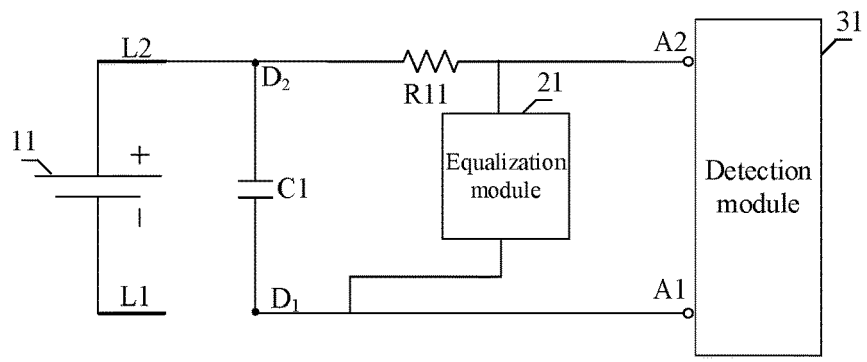
FIG. 6B-FIG. 6E are schematic structural diagrams of a part of a sampling detection circuit according to an example of an embodiment of the present disclosure.

FIG. 6B is a schematic structural diagram of a part of a sampling detection circuit according to an example of an embodiment of the disclosure. As shown in FIG. 6B, the equalization module 21 represents an odd numbered equalization module among the sampled equalization modules, and the voltage sampling line L1 is a second voltage sampling line corresponding to the equalization module 21.

When the voltage sampling line L1 is in malfunction, it is necessary to consider whether or not electric energy is stored on the energy storage module C1. The following descriptions will be divided into two situations for specific explanation.

In a first situation the energy storage module C1 has stored electric energy before the step S210, and the voltage $V_{C11}$ across the energy storage module C1 is not greater than the voltage across the battery cell 11. Specifically, since electric energy stored by the energy storage module C1 is provided by the battery cell 11, the voltage across the energy storage module C1 is less than the voltage across the battery cell 11 during energy storage by the energy storage module C1; the voltage across the energy storage module C1 is equal to the voltage across the battery cell 11 upon completing energy storage by the energy storage module.

When the step S210 is performed, the equalization module 21 is turned off, and thus the first sampled data collected across the equalization module $V_{11}=V_{C11}$.

When the step S220 is performed, the equalization module 21 is turned on, and thus the energy storage module C1 discharges electric energy along a loop comprising the energy storage module C1 and equalization module 21. In the process of discharge, the second sampled data $V_{21}$ is smaller than $V_{11}*\alpha_1$. When all electrical energy stored in the energy storage module has been completely discharged, the second sampled data $V_{21}=0$.

When the step S230 is performed, the third sample data $V_{31}=0$ because all electrical energy stored in the energy storage module C1 has been completely discharged.

In summary, in the first situation, the first sampled data, the second sampled data and the third sampled data corresponding to the energy storage module satisfy the second determination condition.

In a second situation, no electrical energy is not stored on the energy storage module C1 before the step S210. For example, the voltage sampling line L1 has failed before the battery cell 11 supplies voltage for the energy storage module C1. In this case, the first sample data, the second sample data and the third sample data of the equalization module 21 are all zero.

As a fifth example, a second voltage sampling line corresponding to an even numbered equalization module among the equalization modules is open-circuited. For example, in the case that the battery module has an even number of battery cells, a second voltage sampling line corresponding to a last battery cell in the battery module is open-circuited. A malfunction in a second voltage sampling line in this example will be explained in detail based on a part of the sampling detection circuit.

Figure 6C:
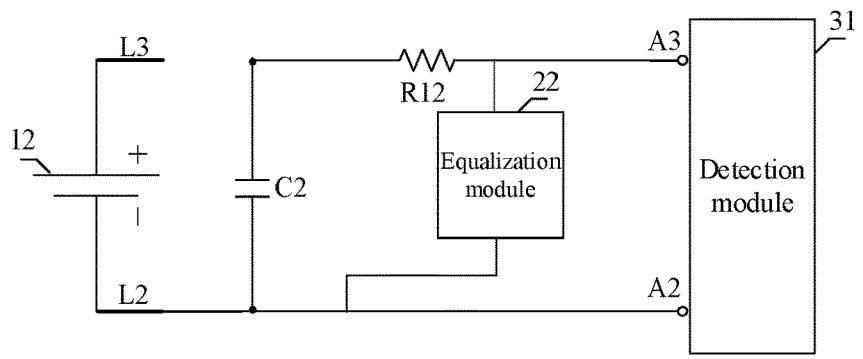

FIG. 6C is a schematic structural diagram of a part of a sampling detection circuit according to an example of an embodiment of the disclosure. As shown in FIG. 6C, the equalization module 22 represents an even numbered equalization module among the sampled equalization modules, and the voltage sampling line L3 is the second voltage sampling line corresponding to the equalization module 22.

When the voltage sampling line L3 is in malfunction, it is necessary to consider whether or not electric energy is stored on the energy storage module C2. The following descriptions will be divided into two situations for specific explanation.

In a first situation, the energy storage module C2 has stored electric energy before the step S210. Since electric energy stored by the energy storage module C2 is provided by the battery cell 12, the voltage across the energy storage module C2 is not greater than the voltage across the battery cell 12.

When the step S210 is performed, the equalization module 22 is turned off, and the first sampled data collected across the equalization module 22 is $V_{12}=V_{C12}$.

When the step S220 is performed, the equalization module 22 is turned off, and the second sampled data collected across the equalization module 22 is $V_{22}=V_{12}$.

When the step S230 is performed, the energy storage module C2 discharges electric energy along a loop comprising the energy storage module C2 and the equalization module 22. In the process of discharge, the third sampled data $V_{32}$ is smaller than $V_{12}*\alpha_2$. When all electrical energy stored in the energy storage module has been completely discharged, the third sampled data $V_{32}=0$.

In summary, in the first situation, the first sampled data, the second sampled data, and the third sampled data of the equalization module satisfy the second determination condition.

In a second situation no electrical energy is not stored on the energy storage module C2 before the step S210. In this case, the first sampled data, the second sampled data and the third sampled data of the equalization module 22 are all zero.

As a sixth example, a second voltage sampling line is in malfunction, and an equalization module corresponding to the second voltage sampling line also is in malfunction.

Figure 6D:
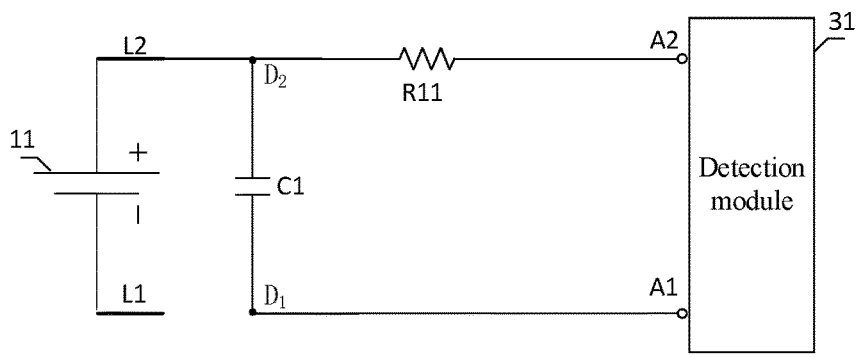

FIG. 6D is a schematic structural diagram of a part of a sampling detection circuit according to an example of an embodiment of the disclosure. As shown in FIG. 6D, the voltage sampling line L1 represents a second voltage sampling line corresponding to the equalization module 21.

When the voltage sampling line L1 is in malfunction and the equalization module 21 is open-circuited, it is necessary to consider whether or not electric energy is stored on the energy storage module C1. The following descriptions will be divided into two situations for specific explanation.

In a first situation, the energy storage module C1 has stored electric energy before the step S210. Since electric energy stored by the energy storage module C1 is provided by the battery cell 11, the voltage $V_{C11}$ across the energy storage module C1 is not greater than the voltage across the battery cell 11.

When the step S210 is performed, the equalization module 21 is open-circuited, and thus the first sampled data collected across the equalization module is $V_{11}=V_{C11}$.

When the step S220 is performed, the equalization module 21 is open-circuited, and thus the second sampled data collected across the equalization module is $V_{21}=V_{11}$.

When the step S230 is performed, the equalization module 21 is open-circuited, and thus the third sampled data collected across the equalization module is $V_{31}=V_{11}$.

In summary, in the first situation of the sixth example, if the second sampled data and the third sampled data satisfy the first determination condition, it can be determined that the equalization module is disconnected.

It should be noted that if the first sampled data, the second sampled data and the third sampled data of an equalization module corresponding to a second voltage sampling line are equal and are not equal to zero, and the first sampled data, the second sampled data and the third sampled data of the equalization module satisfy the first determining condition, it can be determined that the equalization module is in malfunction.

In a second situation, no electrical energy is not stored on the energy storage module C1. In this case, the first sample data, the second sample data, and the third sample data of the equalization module 21 are all zero.

Figure 6E:
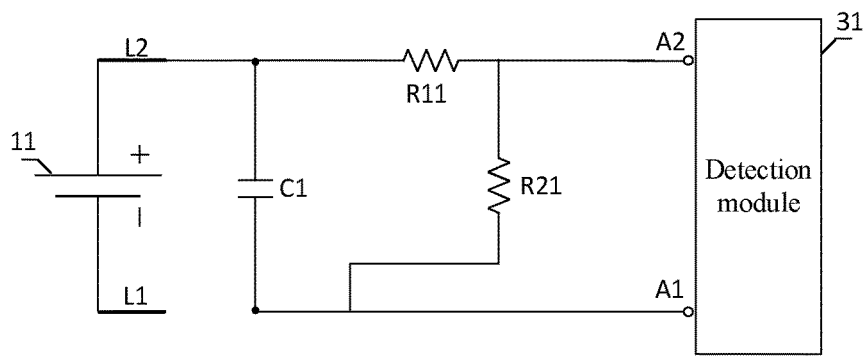

FIG. 6E is a schematic structural diagram of a part of a sampling detection circuit according to an example of an embodiment of the disclosure.

As shown in FIG. 6E, in a third situation, when the equalization module 21 is short-circuited, the electrical energy stored in the energy storage module C1 is released along a loop comprising the energy storage module C1 and the equalization module 21. Therefore, the first sample data, the second sample data and the third sample data of the equalization module are all zero.

In summary, in the second situation of the fourth example, the second situation of the fifth example, and the second and the third cases of the sixth example, the first sampled data and the second sampled data and the third sampled data are all equal to zero.

Therefore, in some embodiments of the present disclosure, if the first sampled data, the second sampled data and the third sampled data of an equalization module corresponding a second voltage sampling line are all zero, it can be determined that the second voltage sampling line is in malfunction.

In some embodiments of the present disclosure, the specific implementation of the step S242 may include: determining, if the second sampled data of an equalization module among the sampled equalization modules satisfies the second determination condition, and the second sampled data of an adjacent equalization modules among the sampled equalization modules satisfies the second determination condition, a malfunction of a voltage sampling line between the equalization module and the adjacent equalization module; and determining, if the third sampled data of an equalization module among the sampled equalization modules satisfies the second determination condition, and the third sampled data of an adjacent equalization module among the sampled equalization modules satisfies the second determination condition, a malfunction of a voltage sampling line between the equalization module and the adjacent equalization module.

In the step S242, if a first voltage sampling line of two or more adjacent equalization modules is in malfunction, the battery cells corresponding to the first voltage sampling line are connected in series. In the case where the equalization module corresponding to the first voltage sampling line is used as a sampled equalization module, when the step S220 is performed, the impedance of an energy storage module connected in parallel with an odd numbered equalization module among the sampled equalization module is reduced, so the odd numbered equalization module satisfy the second determination condition. Correspondingly, the voltage across an even numbered equalization module is increased, and thus the even numbered equalization module satisfy the second determination condition.

When the S230 is executed, the impedance of an energy storage module connected in parallel with an even numbered equalization module among the sampled equalization modules is reduced, and thus the even numbered equalization module satisfies the second determination condition. Correspondingly, the voltage of an odd numbered equalization module among the sampled equalization modules is increased, and thus the odd numbered equalization module satisfies the second determination condition.

Therefore, if second sampled data of an equalization module and second sampled data of an adjacent equalization module both satisfy the second determination condition, or third sampled data of an equalization module and third sampled data of an adjacent equalization modules both satisfies the second determination condition, it can be determined that a voltage sampling line between the equalization module and the adjacent equalization module is in malfunction.

For example, as shown in FIG. 6A, when any one of the equalization module 21 and the equalization module 22 is turned off, sampled data collected across the equalization module 21 and sampled data collected across the equalization module 22 both satisfy the second determination condition.

Specifically, when the step S220 is performed, the equalization module 21 is turned on, and the equalization module 22 is turned off. In this case, the second sampled data of the equalization module 21 is smaller than a product of the first sampled data of the equalization module 21 and a voltage division coefficient of the equalization module 21, and the second sampled data of the equalization module 22 is larger than the first sampled data of the equalization module 22.

When the step S230 is performed, the equalization module 21 is turned off, and the equalization module 22 is turned on. In this case, the third sampled data of the equalization module 21 is greater than the first sampled data of the equalization module 21, and the third sampled data of the equalization module 22 is smaller than a product of the first sampled data of the equalization module 22 and a voltage division coefficient of the equalization module 22.

In some embodiments of the present disclosure, in addition to the case where an equalization module is open-circuited/short-circuited in the above embodiments, there exists a case where an equalization module is open-circuited/short-circuited and a first voltage sampling line corresponding to the equalization module is also in malfunction.

When an even numbered equalization module among the sampled equalization modules is open-circuited/short-circuited, the first determination condition may further include: the second sampled data of an odd numbered equalization module among the sampled equalization modules is smaller than a first threshold, and the third sampled data of the odd numbered equalization module is equal to the first sample data of the odd numbered equalization module, or the second sampled data of an even numbered equalization module among the sampled equalization modules is greater than the first sampled data of the even numbered equalization module, and the third sampled data of the even numbered equalization module is equal to the first sampled data of the even numbered equalization module, wherein the first threshold is a product of the first sampled data of the odd numbered equalization module and a voltage division coefficient of the odd numbered equalization module.

As a seventh example, an even numbered equalization module is in malfunction, and a first voltage sampling line corresponding to the equalization module is also in malfunction.

Taking i=2 as an example, a situation in which an even numbered equalization module is open-circuited is specifically explained. The equalization module 21 represents an odd numbered equalization module among the sampled equalization modules, and the equalization module 22 represents an even numbered equalization module among the sampled equalization modules.

Figure 7A:
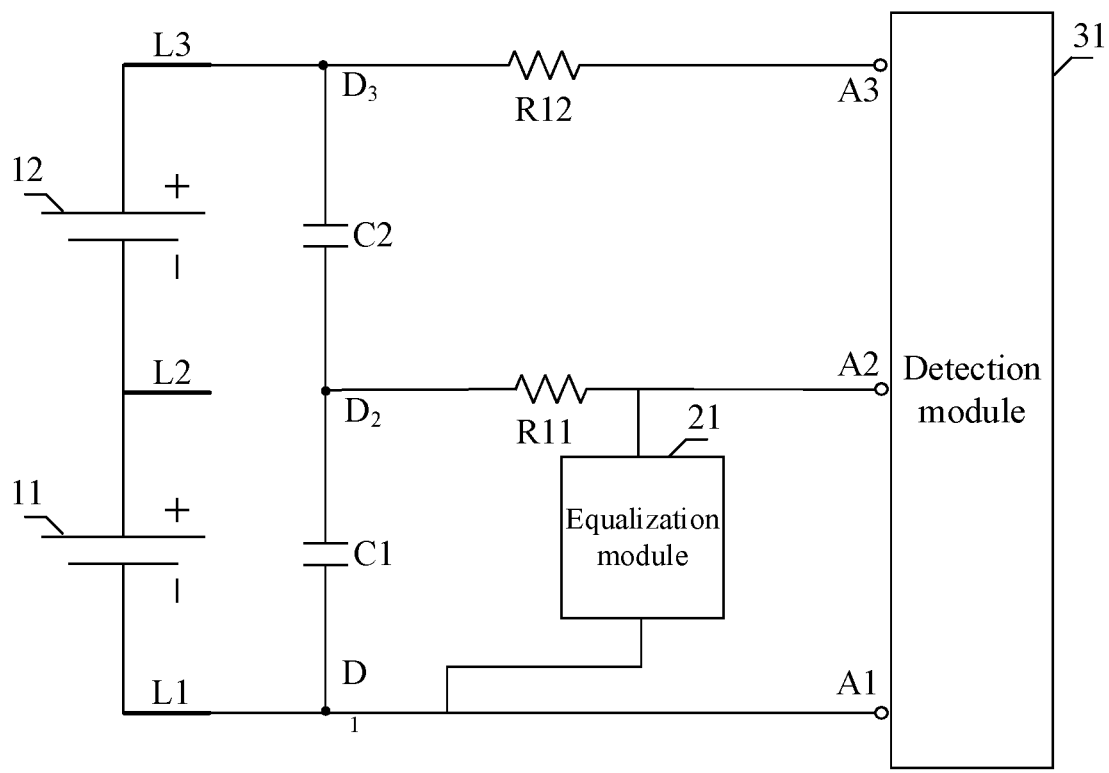
FIG. 7A and FIG. 7B are schematic structural diagrams of a part of a sampling detection circuit according to an example of an embodiment of the present disclosure.

FIG. 7A is a schematic structural diagram of a sampling detection circuit according to an example of an embodiment of the disclosure. As shown in FIG. 7A, the first voltage sampling line L2 is open-circuited and the equalization module 22 is open-circuited.

When the step S210 is performed, the equalization module 21 is turned off, and the equalization module 22 is open-circuited. The first sampled data $V_{11}$ collected across the equalization module 21 is the voltage $V_{C11}$ across the energy storage module C1. The first sampled data $V_{12}$ collected across the equalization module 22 is the voltage $V_{C12}$ across the energy storage module C2.

When the step S220 is performed, since the equalization module 21 is turned on, the equivalent impedance between the points $D_1$ and $D_2$ at both terminals of the energy storage module C1 is smaller than the impedance of the energy storage module C1. Since the voltage allocated on the energy storage module C1 is less than $V_{11}$, the second sampled data $V2i$ collected across the equalization module 21 is smaller than $V_{11} \times \alpha_1$. Correspondingly, since the voltage between the two points $D_1$ and $D_3$ is always equal to a sum of the voltage of the battery cell 11 and the voltage of the battery cell 12, and the second sampled data $V_{22}$ collected across the equalization module 22 is greater than $V_{12}$.

When the step S230 is performed, the equalization module 21 is turned off, and the equalization module 22 is open-circuited. The third sampled data $V_{31}$ collected across the equalization module 21 is equal to the first sampled data $V_{11}$ collected across the equalization module 21. The third sampled data $V_{32}$ collected across the equalization module 22 is equal to the first sampled data $V_{12}$ collected at both ends of the equalization module 22.

As an eighth example, a situation where an even numbered equalization module among the sampled equalization modules in this example is short-circuited is specifically explained by taking i=2 as an example. The equalization module 21 represents an odd numbered equalization module among the sampled equalization modules, and the equalization module 22 represents an even numbered equalization module among the sampled equalization modules.

Figure 7B:
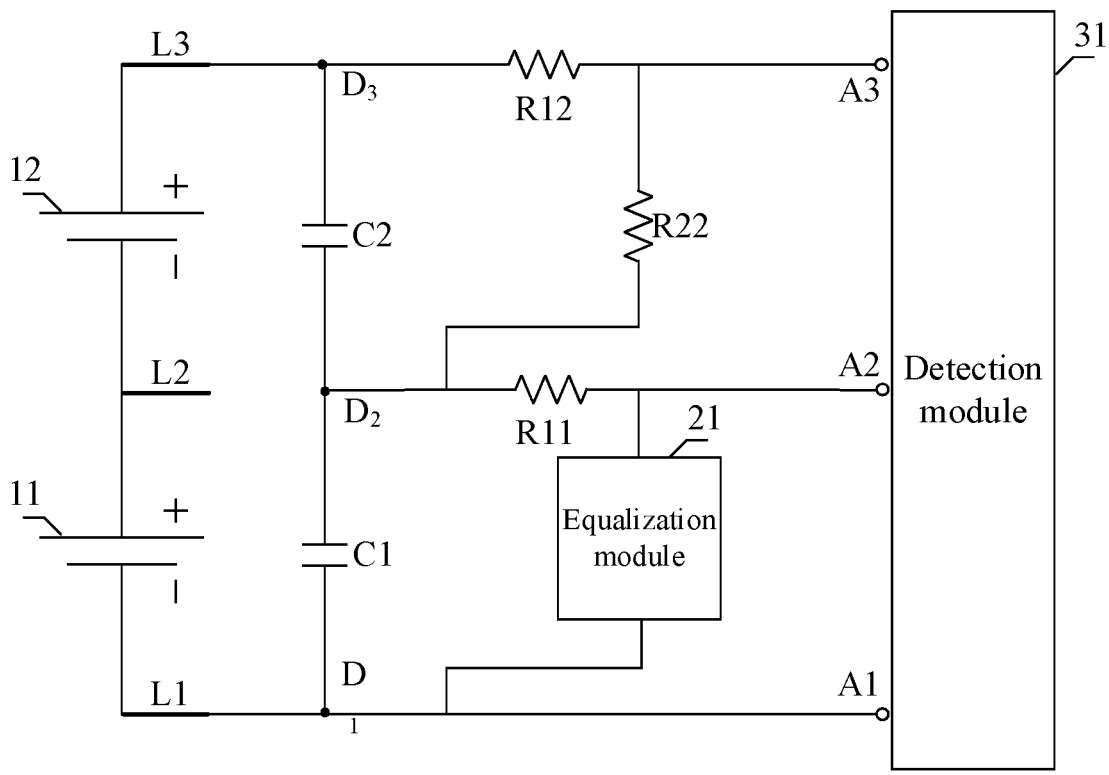

FIG. 7B is a schematic structural diagram of a sampling detection circuit according to an example of an embodiment of the disclosure. As shown in FIG. 7B, the first voltage sampling line L2 is open-circuited and the equalization module 22 is short-circuited.

When the step S210 is performed, the equalization module 21 is turned off, and the equalization module 22 is short-circuited. The first sampled data $V_{11}$ collected across of the equalization module 21 is the voltage $V_{C11}$ across the energy storage module C1. The first sampled data $V_{12}$ collected across the equalization module 22 is a product of the voltage $V_{C12}$ across the energy storage module C2 and a voltage division coefficient $\alpha_2$, $V_{12}=V_{C12}\times\alpha_2$.

When the step S220 is performed, the equalization module 21 is turned on and the equalization module 22 is short-circuited. The equivalent impedance between the points D1 and D2 at both terminals of the energy storage module C1 is smaller than the impedance of the energy storage module C1. The voltage allocated on the energy storage module C1 is less than $V_{11}$, and accordingly, the voltage allocated on the energy storage module C2 is greater than $V_{C12}$. The second sampled data $V_{21}$ collected across the equalization module 21 is smaller than $V_{11}\times\alpha_1$. The second sampled data $V_{22}$ collected across the equalization module 22 is greater than $V_{12}$.

When the step S230 is performed, the equalization module 21 is turned off and the equalization module 22 is short-circuited. The third sampled data V31 collected across the equalization module 21 is equal to the first sampled data V11 collected across the equalization module 21. The third sampled data V32 collected across the equalization module 22 is equal to the first sampled data V12 collected at across the equalization module 22.

According to the seventh example and the eighth example, it can be known that when an even numbered equalization module is open-circuited/short-circuited, and the first voltage sampling line of the equalization module is in malfunction, the second sampled data and the third sampled data of the equalization module satisfy the first determination condition. Therefore, if second sampled data and the third sampled data of a sampled equalization module satisfy the first determining condition, it can be determined that the sampled equalization module is in malfunction.

In other embodiments of the present disclosure, in addition to the above-described situation where an even numbered equalization module is open-circuited/short-circuited, and the first voltage sampling line corresponding to the even numbered equalization module is also in malfunction, there is also a case where an odd numbered equalization module open-circuited/short-circuited, and the first voltage sampling line corresponding to the odd numbered equalization module is also in malfunction.

In this case, the first determining condition may further include: the second sampled data of an odd numbered equalization module among the sampled equalization modules is equal to the first sampled data of the odd numbered equalization module, and the third sampled data of the odd numbered equalization module is greater than the first sampled data of the odd numbered equalization module, or the second sampled data of an even numbered equalization module among the sampled equalization modules is equal to the first sampled data of the even numbered equalization module, and the third sampled data of the even numbered equalization module is smaller than a second threshold, wherein the second threshold is a product of the first sampled data of the even numbered equalization modules and a voltage division coefficient of the even numbered equalization module.

As a ninth example, a situation where an odd numbered equalization module among the sampled equalization modules is open-circuited in the example is specifically explained by taking i=2 as an example. The equalization module 21 represents an odd numbered equalization module among the sampled equalization modules, and the equalization module 22 represents an even numbered equalization module among the sampled equalization modules.

Figure 8A:
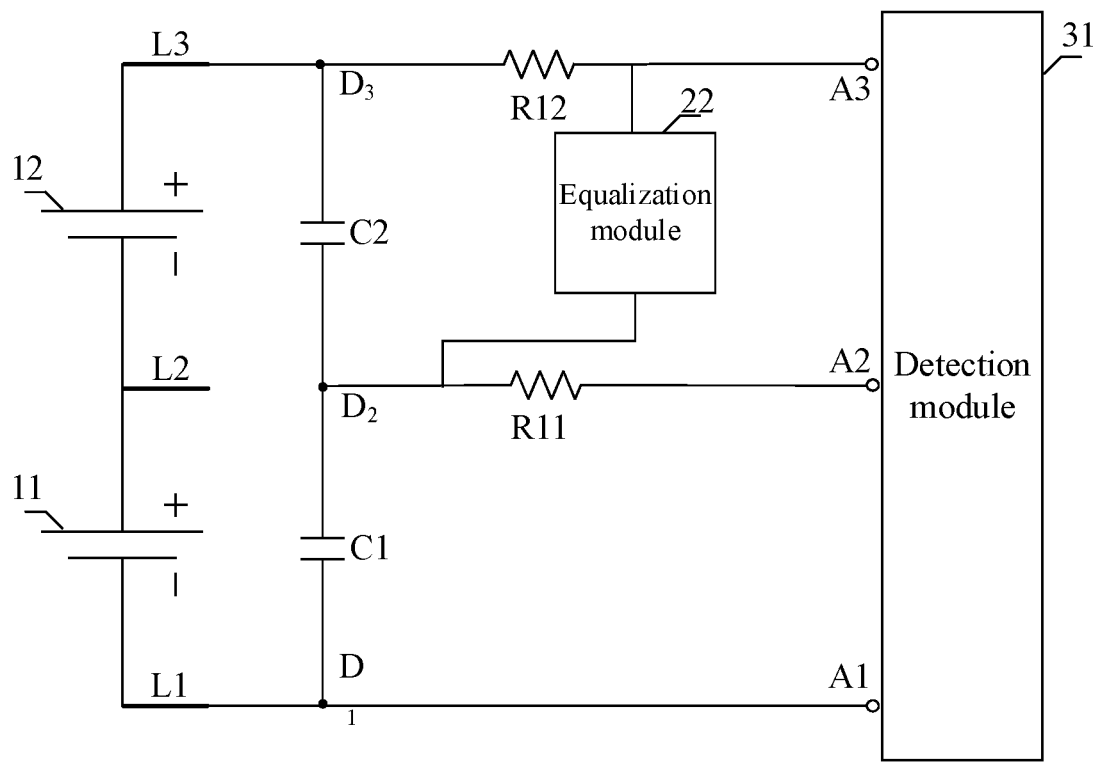
FIG. 8A and FIG. 8B are schematic structural diagrams of a part of a sampling detection circuit according to an example of an embodiment of the present disclosure.

FIG. 8A is a schematic structural diagram of an example of a sampling detection circuit according to an embodiment of the present disclosure. As shown in FIG. 8A, the first voltage sampling line L2 is open-circuited and the equalization module 21 is open-circuited.

When the step S210 is performed, the equalization module 21 is open-circuited and the equalization module 22 is turned off. The first sampled data $V_{11}$ collected across the equalization module 21 is the voltage $V_{C11}$ across the energy storage module C1. The first sampled data $V_{12}$ collected across the equalization module 22 is the voltage $V_{C12}$ across the energy storage module C2.

When the step S220 is performed, the equalization module 21 is open-circuited and the equalization module 22 is turned off. The second sampled data $V_{21}$ collected across the equalization module 21 is equal to the first sampled data $V_{11}$ collected across the equalization module 21. The second sampled data $V_{22}$ collected across the equalization module 22 is equal to the first sampled data $V_{12}$ collected across the equalization module 22.

When the step S230 is performed, the equalization module 21 is open-circuited and the equalization module 22 is turned on. The voltage allocated on the energy storage module C2 is less than $V_{12}$, and the third sampled data $V_{32}$ collected across the equalization module 22 is smaller than $V_{12}\times\alpha\_2$. Correspondingly, the third sampled data $V_{31}$ collected across the equalization module 21 is greater than $V_{11}$.

As a tenth example, a situation where an odd numbered equalization module is short-circuited in this example is specifically explained by taking i=2 as an example. The equalization module 21 represents an odd numbered equalization module among the sampled equalization modules, and the equalization module 22 represents an even numbered equalization module among the sampled equalization modules.

Figure 8B:
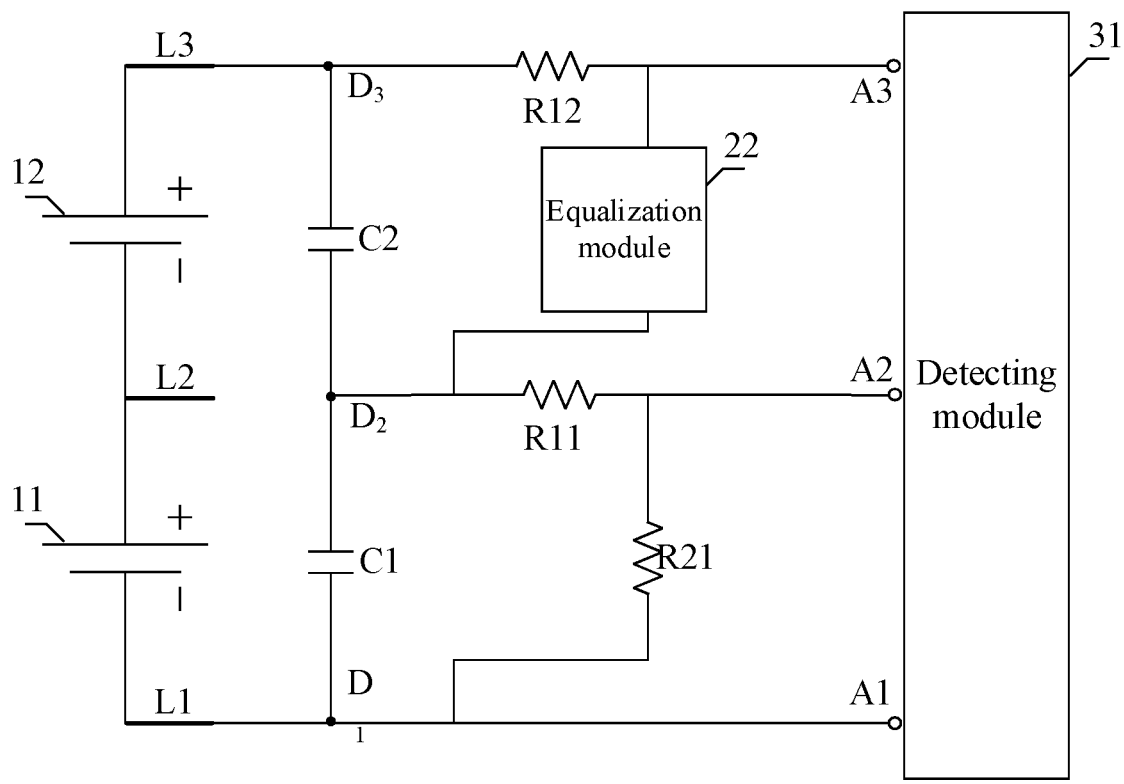

FIG. 8B is a schematic structural diagram of a sampling detection circuit according to an example of an embodiment of the present disclosure. As shown in FIG. 8B, the first voltage sampling line L2 is open-circuited and the equalization module 21 is shorted-circuited.

When the step S210 is performed, the equalization module 21 is short-circuited and the equalization module 22 is turned off. The first sampled data $V_{11}$ collected across the equalization module 21 is a product of the voltage $V_{C11}$ across the energy storage module C1 and a voltage division coefficient $\alpha_1$, $V_{11}=V_{C11}\times\alpha_1$. The first sampled data $V_{12}$ collected across the equalization module 22 is the voltage $V_{C12}$ across the energy storage module C2.

When the step S220 is performed, the equalization module 21 is short-circuited and the equalization module 22 is turned off. The second sampled data $V_{21}$ collected across the equalization module 21 is equal to the first sampled data $V_{11}$ collected across the equalization module 21. The second sampled data $V_{22}$ collected across the equalization module 22 is equal to the first sampled data $V_{12}$ collected across the equalization module 22.

When the step S230 is executed, the equalization module 21 is short-circuited, and the equalization module 22 is turned on. The voltage allocated on the energy storage module C2 is less than $V_{12}$, and the third sampled data V32 collected across the equalization module 22 is smaller than $V_{12} \times \alpha_2$. Correspondingly, the third sampled data $V_{31}$ collected across the equalization module 21 is greater than $V_{11}$.

According to the ninth example and the tenth example, it can be known that when an odd numbered equalization module is open-circuited/short-circuited and the first voltage sampling line of the equalization module is in malfunction, the second sampled data and the third sampled data of the equalization module satisfy the first determination condition. Therefore, if second sampled data and third sampled data of a sampled equalization module satisfy the first determining condition, it can be determined that the sampled equalization module fails.

In some embodiments of the present disclosure, in the case where a plurality of adjacent first voltage sampling lines are open-circuited and a part of odd numbered equalization modules are open-circuited/short-circuited, the first determination sub-condition may further include: second sampled data of an odd numbered equalization module among the sampled equalization modules is greater than first sample data of the odd numbered equalization module. The situation where a part of odd numbered equalization modules are open-circuited/short-circuited indicates that at least one of odd numbered equalization modules corresponding to the failed first voltage sampling line is normal.

As an eleventh example, a situation where the first voltage sampling line fails that satisfies the second determination condition in the example is specifically explained by taking i=3 as an example. The equalization module 21 and the equalization module 23 represent odd numbered equalization numbers among the sampled equalization modules, and the equalization module 22 represents an even numbered equalization module among the sampled equalization modules.

Figure 9A:
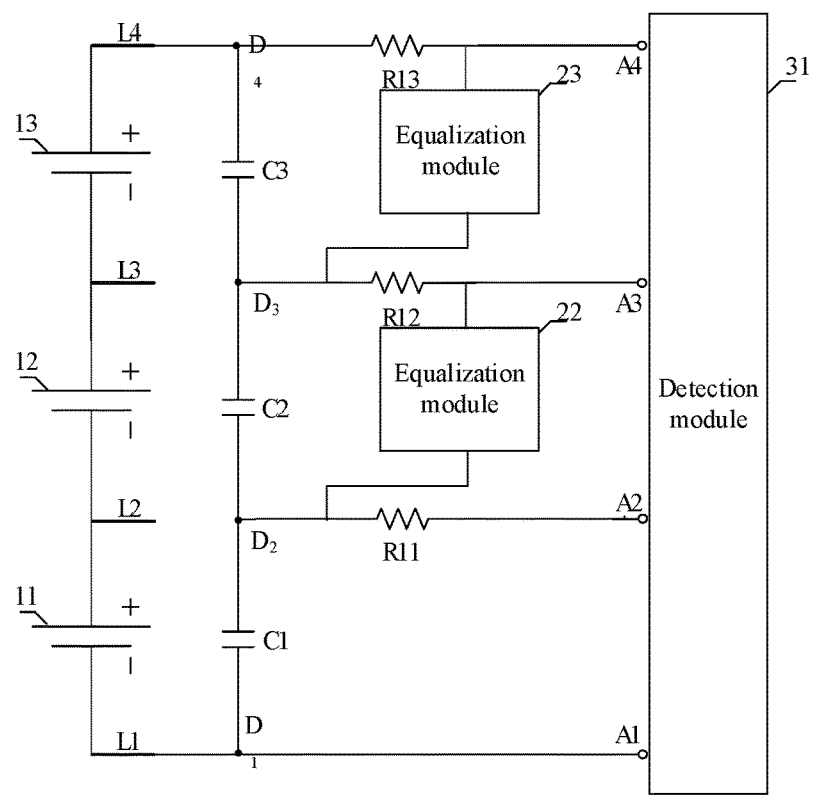
FIG. 9A and FIG. 9B are schematic structural diagrams of a part of a sampling detection circuit according to an example of an embodiment of the present disclosure.

FIG. 9A is a schematic structural diagram of a sampling detection circuit according to an example of an embodiment of the present disclosure. As shown in FIG. 9A, the first voltage sampling line L2 and the first voltage sampling line L3 are open-circuited, and the equalization module 21 is open-circuited.

When the step S210 is performed, the equalization module 21 is open-circuited, the equalization module 22 is turned off, and the equalization module 23 is turned off. The first sampled data $V_{11}$ collected across the equalization module 21 is the voltage $V_{C11}$ across the energy storage module C1, the first sampled data $V_{12}$ collected across the equalization module 22 is the voltage $V_{C12}$ across the energy storage module C2, and the first sampled data $V_{13}$ collected across the equalization module 23 is the voltage $V_{C13}$ across the energy storage module C3.

When the step S220 is performed, the equalization module 21 is open-circuited, the equalization module 22 is turned off, and the equalization module 23 is turned on. The voltage allocated on the energy storage module C3 is less than $V_{13}$, and accordingly, since the voltage between the two points $D_1$ and $D_4$ is always equal to a sum of the voltage across the battery cell 11, the voltage across the battery cell 12 and the voltage across the battery cell 13, the voltage allocated on the energy storage module C1 is greater than $V_{C11}$ and the voltage allocated on the energy storage module C2 is greater than $V_{C12}$.

In this case, the second sampled data V21 collected across the equalization module 21 is greater than the first sampled data V11 of the equalization module 21, and the second sampled data V22 collected across the equalization module 22 is greater than the first sampled data V12 of the equalization module 22, and the second sample data V23 of the equalization module 23 is smaller than a product of the first sample data V13 of the equalization module 23 and a voltage division coefficient $\alpha_3$ of the equalization module 23. The calculation method of the $\alpha_3$ is the same as the calculation method of the $\alpha_k$, and details are not described herein again.

When the step 230 is performed, the equalization module 21 is open-circuited, the equalization module 22 is turned on, and the equalization module 23 is turned off. The voltage allocated on the energy storage module C2 is smaller than $V_{C12}$. Accordingly, the voltage allocated on the energy storage module C1 is greater than $V_{C11}$, and the voltage allocated on the energy storage module C3 is greater than $V_{C13}$.

In this case, the third sampled data $V_{31}$ collected across the equalization module 21 is greater than $V_{11}$, and the third sampled data $V_{32}$ collected across the equalization module 22 is smaller than a product of the $V_{12}$ and a voltage division coefficient $\alpha_2$, and the third sampled data $V_{33}$ collected across the equalization module 23 is greater than $V_{13}$.

It should be noted that in the case where the equalization module 21 is short-circuited, relationship between the first sampled data and the second sampled data and relationship between the first sampled data and the third sampled data of each of the equalization module 21, the equalization module 22 and the equalization module 23 are the same as in the present example and will not be described here.

However, values of the first sampled data, the second sampled data and the third sampled data of the short-circuited equalization module 21 are different from those of the present example. Specifically, value of the first sampled data of the short-circuited equalization module 21 in the present example is equal to the voltage $V_{C11}$ across the energy storage module C1, while value of the first sampled data of the short-circuited equalization module 21 in the mentioned case is equal to a product of the voltage $V_{C11}$ across the energy storage module C1 and a voltage division coefficient $\alpha_1$.

It should be further noted that in the case where both the first equalization module 21 and the second equalization module 22 are short-circuited, relationship between the first sampled data and the second sampled data of each of the equalization module 21, the equalization module 22 and the equalization module 23 is the same as that in the present example. However, the third sampled data of the equalization module 21 is equal to the first sampled data of the equalization module 21, the third sampled data of the equalization module 22 is equal to the first sampled data of the equalization module 22, and the third sampled data of the equalization module 23 is equal to the first sampled data of the equalization module 23.

In summary, in the case where a portion of odd numbered equalization modules is open-circuited/short-circuited and a plurality of adjacent first voltage sampling lines are disconnected, the second sampled data of the odd numbered equalization modules satisfies the first determining sub-condition. Therefore, if second sampled data of an odd numbered equalization module satisfies the first determining sub-condition, it can be determined that the first voltage sampling line of the odd numbered equalization module fails and the equalizing module also fails.

In some embodiments of the present disclosure, in the case where a plurality of adjacent first voltage sampling lines are disconnected and a part of even numbered equalization modules is open-circuited/short-circuited, the second determination sub-condition may include: the third sampled data of an even numbered equalization module among the sampled equalization modules is greater than the first sampled data of the even numbered equalization module. The situation where a part of even numbered equalization modules is open-circuited/short-circuited indicates that at least one of even numbered equalization modules corresponding to a failed first voltage sampling line is in normal.

As a twelfth example, the situation where the first voltage sampling line fails that satisfies the second determination condition in the present example is specifically explained by taking i=3 as an example. The equalization module 22 and the equalization module 24 represent even numbered equalization modules among the sampled equalization modules, and the equalization module 23 represents an odd numbered equalization module among the sampled equalization modules.

Figure 9B:
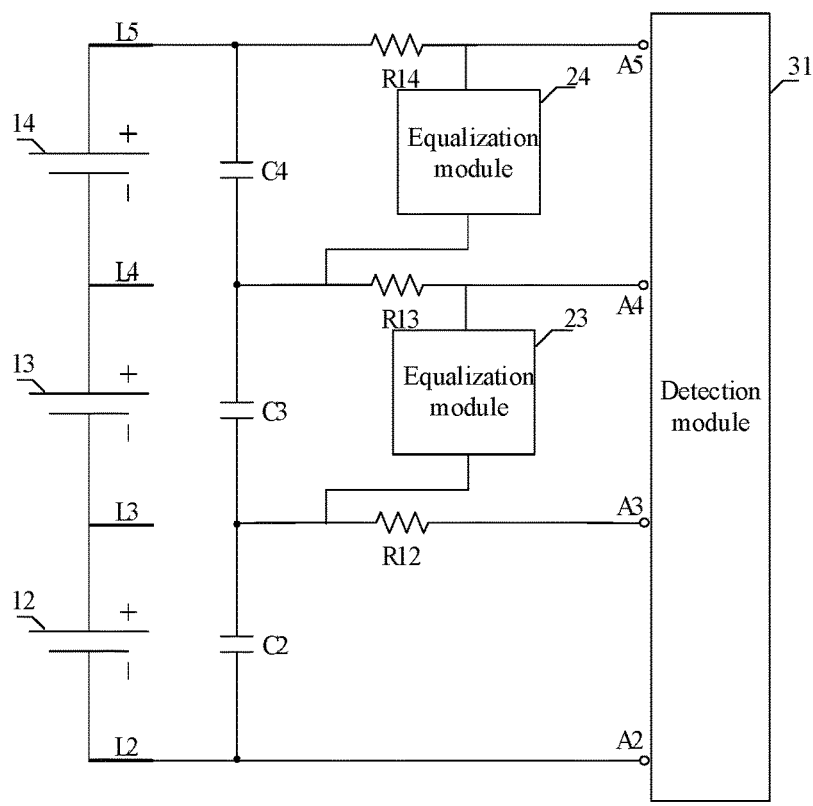

FIG. 9B is a schematic structural diagram of a sampling detection circuit according to an example of an embodiment of the disclosure. As shown in FIG. 9B, the first voltage sampling line L3 and the first voltage sampling line L4 are disconnected, and the equalization module 22 is open-circuited.

When the step S210 is performed, the equalization module 22 is open-circuited, the equalization module 23 is turned off, and the equalization module 24 is turned off. The first sampled data $V_{12}$ collected across the equalization module 22 is the voltage $V_{C12}$ across the energy storage module C2, and the first sampled data $V_{13}$ collected across the equalization module 23 is the voltage $V_{C13}$ across the energy storage module C3, and the first sampled data $V_{14}$ collected across the equalization module 24 is the voltage $V_{C14}$ across the energy storage module C2.

When the step S220 is performed, the equalization module 22 is open-circuited, the equalization module 23 is turned on, and the equalization module 24 is turned off. The voltage allocated on the energy storage module C3 is smaller than the $V_{C13}$. Accordingly, the voltage allocated on the energy storage module C2 is greater than $V_{C12}$, and the voltage allocated on the energy storage module C4 is greater than $V_{C14}$.

In this case, the second sampled data $V_{22}$ collected across the equalization module 22 is greater than $V_{12}$, and the second sampled data $V_{24}$ collected across the equalization module 24 is greater than $V_{14}$, and the second sampled data $V_{23}$ collected across the equalization module 23 is less than a product of $V_{13}$ and a voltage division coefficient $\alpha_3$.

When the step S230 is performed, the equalization module 22 is open-circuited, the equalization module 23 is turned off, and the equalization module 24 is turned on. The voltage allocated on the energy storage module C4 is smaller than the $V_{C14}$. Accordingly, the voltage allocated on the energy storage module C2 is greater than $V_{C12}$, and the voltage allocated on the energy storage module C3 is greater than $V_{C13}$.

In this case, the third sampled data V32 collected across the equalization module 22 is greater than V12, and the third sampled data V33 collected across the equalization module 23 is greater than V13, and the voltage across the equalization module 24 is less than a product of V24 and a voltage division coefficient $\alpha_4$ of the equalization module 24. The calculation method of $\alpha_4$ is the same as the calculation method of $\alpha_k$, and will not be described again here.

It should be noted that when the equalization module 22 is short-circuited, relationship between the first sample data and the second sample data and relationship between the first sample data and the third sample data of each of the equalization module 22, the equalization module 23 and the equalization module 24 are the same as those in the present example and will not be described here.

It should be further noted that when the equalization module 22 and the equalization module 23 are simultaneously open-circuited/short-circuited, relationship between the first sampled data and the third sampled data of each of the equalization module 22, the equalization module 23 and the equalization module 24 is the same as that in the present example. However, The second sample data of the equalization module 22 is equal to the first sample data of the equalization module 22, the second sample data of the equalization module 23 is equal to the first sample data of the equalization module 23, and the second sample data of the equalization module 24 is equal to the first sampled data of the equalization module 24.

In summary, in the case where an even numbered equalization module is open-circuited/short-circuited and a plurality of adjacent voltage sampling lines are disconnected, the third sample data of an even numbered equalization module satisfies the second determination sub-condition. Therefore, if third sample data of an even numbered equalization module satisfies the second determination sub-condition, it can be determined that a third voltage sampling line of the even numbered equalization module is in malfunction and the even numbered equalization module is also in malfunction.

It should be noted that, in embodiments of the present disclosure, the step S230 may be placed after the step S220 or before S220, and the execution order between the step S220 and the step S230 is not limited.

Further, it should be noted that a detection module 31 or a control module may be added to the sampling detection circuit in embodiments of the present application to implement the method for detection a circuit malfunction in the above embodiments of the present application. That is, method for detection a circuit malfunction 200 in the above embodiments of the present application may be implemented by a detection module 31 or a control module of the sampling detecting circuit 100.

It should be understood that the various embodiments in the specification are described in a progressive manner, and the same or similar parts between the various embodiments may be referred to each other, and each embodiment focuses on the difference from other embodiments. The method embodiment is described in a relatively simple manner. For related information, please refer to the description part of the system embodiment. The disclosure is not limited to the specific steps and structures described above and illustrated in the drawings. A person skilled in the art can make various changes, modifications and additions or change the order between the steps under spirit of the disclosure. Also, a detailed description of known methods and techniques is omitted herein for the sake of brevity.

The functional modules (such as the energy storage module, the equalization module, the first resistance module, the detection module, the second resistance module, the third resistance module, the switch unit, and the resistor unit) in the above embodiments may be implemented as hardware, software, firmware, or the combination thereof. When implemented in hardware, it can be, for example, an electronic circuit, an application specific integrated circuit (ASIC), a suitable firmware, plug-ins, function card, and the like. When implemented in software, the elements of the present disclosure are programs or code segments that are used to perform the required tasks. The program or code segments can be stored in a machine readable medium or transmitted over a transmission medium or communication link through a data signal carried in carriers. A "machine-readable medium" may include any medium that can store or transfer information.

What is claimed is:

1. A method for detecting a circuit malfunction, which is applied to a sampling detection circuit, characterized in that:
   the sampling detection circuit comprises: a plurality of energy storage modules, a plurality of equalization modules, and a plurality of first resistance modules,
   wherein one terminal of an energy storage module among the plurality of energy storage modules is connected to one terminal of a battery cell in a battery module, and the other terminal of the energy storage modules is connected to the other terminal of the battery cell,
   wherein one terminal of an corresponding equalization module among the plurality of equalization modules is connected to one terminal of the battery cell, and the other terminal of the corresponding equalization module is connected to the other terminal of the battery cell, and wherein the first resistance module is disposed between the equalization module and the battery cell, and the plurality of equalization modules are sequentially numbered in an arrangement order;
   the method for detecting a circuit malfunction comprises:
   receiving a detection instruction, and controlling, in response to the detection instruction, all of the plurality of equalization modules to be turned off, and collecting first sampled data of sampled equalization modules, wherein the sampled equalization modules comprises one or more of the plurality of equalization modules;
   controlling odd numbered equalization modules among the sampled equalization modules to be turned on and even numbered equalization modules among the sampled equalization modules to be turned off, and collecting second sampled data of the sampled equalization modules;
   controlling the odd numbered equalization modules among the sampled equalization modules to be turned off and the even numbered equalization modules among the sampled equalization modules to be turned on, and collecting third sampled data of the sampled equalization modules; and
   determining, according to the first sampled data, the second sampled data and the third sampled data, a malfunction in the sampling detection circuit, and locating the malfunction.

2. The method for detecting a circuit malfunction according to claim 1, wherein the malfunction in the sampling detection circuit comprises a malfunction of a voltage sampling line in the battery cell and/or a malfunction in the equalization module.

3. The method for detecting a circuit malfunction according to claim 2, wherein the determining, according to the first sampled data, the second sampled data and the third sampled data, a malfunction in the sampling detection circuit and locating the malfunction comprises:
   determining, if the second sampled data of a sampled equalization module among the sampled equalization module and the third sampled data of the sampled equalization module satisfy a first determination condition, a malfunction in the equalization module, wherein the first determination condition is related to the first sampled data of the sampled equalization module;
   determining, if the second sampled data of a sampled equalization modules among the sampled equalization module and/or the third sampled data of the sampled equalization module satisfy a second determination condition, a malfunction in a voltage sampling line corresponding to the sampled equalization module, wherein the second determination condition is related to the first sampled data of the sampled equalization module.

4. The method for detecting a circuit malfunction according to claim 3, wherein the first determination condition comprises: the second sampled data is equal to the first sampled data, and the third sampled data is equal to the first sampled data.

5. The method for detecting a circuit malfunction according to claim 4, wherein the first determination condition further comprises:
   the second sampled data of an odd numbered equalization module among the sampled equalization modules is smaller than a first threshold, and the third sampled data of the odd numbered equalization module is equal to the first sampled data of the odd numbered equalization module, or
   the second sampled data of an even numbered equalization module among the sampled equalization modules is greater than the first sampled data of the even numbered equalization module, and the third sampled data of the even numbered equalization module is equal to the first sampled data of the even numbered equalization module,
   wherein the first threshold is a product of the first sampled data of the odd numbered equalization module and a voltage division coefficient of the odd numbered equalization module.

6. The method for detecting a circuit malfunction according to claim 4, wherein the first determination condition further comprises:
   the second sampled data of an odd numbered equalization module among the sampled equalization modules is equal to the first sampled data of the odd numbered equalization module, and the third sampled data of the odd numbered equalization module is greater than the first sampled data of the odd numbered equalization module, or
   the second sampled data of an even numbered equalization module among the sampled equalization modules is equal to the first sampled data of the even numbered equalization module, and the third sampled data of the even numbered equalization module is smaller than a second threshold,
   wherein the second threshold is a product of the first sampled data of the even numbered equalization modules and a voltage division coefficient of the even numbered equalization module.

7. The method for detecting a circuit malfunction according to claim 3, wherein the second determination condition comprises: a first determination sub-condition or a second determination sub-condition,
   the first determination sub-condition comprises: the second sampled data of an odd numbered equalization module among the sampled equalization module is smaller than a first threshold, or the third sampled data of the odd numbered equalization module is greater than the first sample data of the odd numbered equalization module;

the second determination sub-condition comprises: the second sampled data of an even numbered equalization module among the sampled equalization modules is greater than the first sampled data of the even numbered equalization module, or the third sampled data of the even numbered equalization module is smaller than a second threshold, wherein the first threshold is a product of the first sampled data of the odd numbered equalization module and a voltage division coefficient of the odd numbered equalization module, and the second threshold is a product of the first sampled data of the even numbered equalization module and a voltage division coefficient of the even numbered equalization module.

8. The method for detecting a circuit malfunction according to claim 7, wherein the first determination sub-condition further comprises: the second sampled data of the odd numbered equalization module is greater than the first sample data of the odd numbered equalization module.

9. The method for detecting a circuit malfunction according to claim 7, wherein the second determination sub-condition further comprises: the third sampled data of the even numbered equalization module is greater than the first sampled data of the even numbered equalization module.

10. The method for detecting a circuit malfunction according to claim 3, wherein the determining, if the second sampled data of the sampled equalization modules and/or the third sampled data of the sampled equalization modules satisfy a second determination condition, a malfunction in the voltage sampling line corresponding to the equalization module comprises:

determining, if the second sampled data of an equalization module among the sampled equalization modules satisfies the second determination condition, and the second sampled data of an adjacent equalization modules among the sampled equalization modules satisfies the second determination condition, a malfunction of a voltage sampling line between the equalization module and the adjacent equalization module;

determining, if the third sampled data of an equalization module among the sampled equalization modules satisfies the second determination condition, and the third sampled data of an adjacent equalization module among the sampled equalization modules satisfies the second determination condition, a malfunction of a voltage sampling line between the equalization module and the adjacent equalization module.

11. The method for detecting a circuit malfunction according to claim 7, wherein the determining, if the second sampled data of the sampled equalization modules and/or the third sampled data of the sampled equalization modules satisfy a second determination condition, a malfunction in the voltage sampling line corresponding to the equalization module comprises:

determining, if the second sampled data of an equalization module among the sampled equalization modules satisfies the second determination condition, and the second sampled data of an adjacent equalization modules among the sampled equalization modules satisfies the second determination condition, a malfunction of a voltage sampling line between the equalization module and the adjacent equalization module;

determining, if the third sampled data of an equalization module among the sampled equalization modules satisfies the second determination condition, and the third sampled data of an adjacent equalization module among the sampled equalization modules satisfies the second determination condition, a malfunction of a voltage sampling line between the equalization module and the adjacent equalization module.

12. The method for detecting a circuit malfunction according to claim 8, wherein the determining, if the second sampled data of the sampled equalization modules and/or the third sampled data of the sampled equalization modules satisfy a second determination condition, a malfunction in the voltage sampling line corresponding to the equalization module comprises:

determining, if the second sampled data of an equalization module among the sampled equalization modules satisfies the second determination condition, and the second sampled data of an adjacent equalization modules among the sampled equalization modules satisfies the second determination condition, a malfunction of a voltage sampling line between the equalization module and the adjacent equalization module;

determining, if the third sampled data of an equalization module among the sampled equalization modules satisfies the second determination condition, and the third sampled data of an adjacent equalization module among the sampled equalization modules satisfies the second determination condition, a malfunction of a voltage sampling line between the equalization module and the adjacent equalization module.

13. The method for detecting a circuit malfunction according to claim 9, wherein the determining, if the second sampled data of the sampled equalization modules and/or the third sampled data of the sampled equalization modules satisfy a second determination condition, a malfunction in the voltage sampling line corresponding to the equalization module comprises:

determining, if the second sampled data of an equalization module among the sampled equalization modules satisfies the second determination condition, and the second sampled data of an adjacent equalization modules among the sampled equalization modules satisfies the second determination condition, a malfunction of a voltage sampling line between the equalization module and the adjacent equalization module;

determining, if the third sampled data of an equalization module among the sampled equalization modules satisfies the second determination condition, and the third sampled data of an adjacent equalization module among the sampled equalization modules satisfies the second determination condition, a malfunction of a voltage sampling line between the equalization module and the adjacent equalization module.

14. A sampling detection circuit, wherein the sampling detection circuit comprises a plurality of energy storage modules, a plurality of equalization modules, a plurality of first resistance modules and a detection module, wherein:

one terminal of an energy storage module among the plurality of energy storage modules is connected to one terminal of a battery cell in a battery module, and the other terminal of the energy storage modules is connected to the other terminal of the battery cell, and one terminal of an corresponding equalization module among the plurality of equalization modules is connected to one terminal of the battery cell, and the other terminal of the corresponding equalization module is connected to the other terminal of the battery cell, and the first resistance module is disposed between the equalization module and the battery cell, and wherein the plurality of equalization modules are sequentially numbered in an arrangement order; and the detection module is configured to:

collect, in the case that all of the plurality of equalization modules are turned off, first sampled data of sampled equalization module, wherein the sampled equalization modules comprises one or more of the plurality of equalization modules, collect, in the case that odd numbered equalization modules among the sampled equalization modules are turned on and even numbered equalization modules among the sampled equalization modules are turned off, second sampled data of the sampled equalization modules, collect, in the case that the odd numbered equalization modules among the sampled equalization modules are turned off and the even numbered equalization modules among the sampled equalization modules are turned on, third sampled data of the sampled equalization modules, and detect, according to the first sampled data, the second sampled data, a third sampled data, a malfunction in the sampling detection circuit and locating the malfunction.

15. The sampling detection circuit according to claim 14, wherein the equalization module comprises at least a switch unit and a resistor unit, and one terminal of the switch unit is connected to one terminal of the resistor unit.

16. The sampling detection circuit according to claim 14, wherein the switch unit comprises a semiconductor field effect transistor that is turned on or off according to a detection instruction received by a control terminal of the semiconductor field effect transistor.

17. The sampling detection circuit according to claim 15, wherein the sampling detection circuit further comprises: a plurality of second resistance modules, wherein a control terminal of the switch unit is connected with the second resistance module.

18. The sampling detection circuit according to claim 14, wherein the sampling detection circuit further comprises a plurality of diodes, each diode being corresponding to an equalization module of the equalization modules and being connected in anti-parallel with the equalization module.

* * * * *